United States Patent
Jung et al.

(10) Patent No.: US 12,094,857 B2
(45) Date of Patent: Sep. 17, 2024

(54) METHOD OF MANUFACTURING DISPLAY DEVICE INCLUDING LIGHT EMITTING ELEMENT INK HAVING LIGHT EMITTING DISPERSANT

(71) Applicant: Samsung Display Co., LTD., Yongin-si (KR)

(72) Inventors: Jae Hoon Jung, Seoul (KR); Jong Hyuk Kang, Suwon-si (KR); Sung Chan Jo, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 652 days.

(21) Appl. No.: 17/290,095

(22) PCT Filed: May 31, 2019

(86) PCT No.: PCT/KR2019/006596
§ 371 (c)(1),
(2) Date: Apr. 29, 2021

(87) PCT Pub. No.: WO2020/091174
PCT Pub. Date: May 7, 2020

(65) Prior Publication Data
US 2021/0398956 A1 Dec. 23, 2021

(30) Foreign Application Priority Data
Oct. 30, 2018 (KR) .................. 10-2018-0131036

(51) Int. Cl.
*H01L 25/075* (2006.01)
*C09D 11/037* (2014.01)
(Continued)

(52) U.S. Cl.
CPC ........ *H01L 25/0753* (2013.01); *C09D 11/037* (2013.01); *C09D 11/322* (2013.01);
(Continued)

(58) Field of Classification Search
CPC ............. H01L 33/005–0095; C09D 11/00–54
See application file for complete search history.

(56) References Cited

U.S. PATENT DOCUMENTS

| 2004/0075384 A1* | 4/2004 | Aoki | ..................... B82Y 30/00 |
| | | | 313/506 |
| 2010/0207078 A1 | 8/2010 | Marder et al. | |

(Continued)

FOREIGN PATENT DOCUMENTS

| CN | 105339445 | 2/2016 |
| EP | 3 944 324 | 1/2022 |

(Continued)

OTHER PUBLICATIONS

Partial Supplementary European Search Report, corresponding to European Application No./Patent No. 19880909.7, dated Jun. 23, 2022.

(Continued)

*Primary Examiner* — Jay C Chang
*Assistant Examiner* — Mikka Liu
(74) *Attorney, Agent, or Firm* — KILE PARK REED & HOUTTEMAN PLLC

(57) ABSTRACT

The invention relates to a light-emitting element dispersing agent; a light-emitting element ink comprising the same; and a method for producing a display device. This method for producing a display device may comprise spraying an ink including a solvent, light emitting elements, and a light emitting element dispersant onto a target substrate provided with a first electrode and a second electrode, applying a voltage to the first electrode and the second electrode to generate an electric field on the target substrate, irradiating the ink sprayed on the target substrate with light to form a dispersant fragment in which the light emitting element (Continued)

dispersant is decomposed, and removing the solvent and the dispersant fragment of the ink.

10 Claims, 20 Drawing Sheets

(51) Int. Cl.
    *C09D 11/322* (2014.01)
    *C09D 11/38* (2014.01)
    *C09D 11/50* (2014.01)
    *H01L 25/16* (2023.01)
    *H01L 33/44* (2010.01)

(52) U.S. Cl.
    CPC .............. *C09D 11/38* (2013.01); *C09D 11/50* (2013.01); *H01L 25/167* (2013.01); *H01L 33/44* (2013.01)

(56) References Cited

U.S. PATENT DOCUMENTS

| | | | |
|---|---|---|---|
| 2012/0128899 A1 | 5/2012 | Park | |
| 2015/0280130 A1* | 10/2015 | Sago | H10K 71/135 438/46 |
| 2016/0115383 A1 | 4/2016 | Kuzumoto et al. | |
| 2016/0300889 A1 | 10/2016 | Kim et al. | |

FOREIGN PATENT DOCUMENTS

| | | |
|---|---|---|
| JP | 2011-205106 | 10/2011 |
| KR | 10-2006-0130388 | 12/2006 |
| KR | 10-2008-0103338 | 11/2008 |
| KR | 10-2014-0026442 | 3/2014 |
| KR | 10-2014-0109377 | 9/2014 |
| KR | 10-2016-0038954 | 4/2016 |
| KR | 10-2018-0024308 | 3/2018 |
| WO | 93/14864 | 8/1993 |

OTHER PUBLICATIONS

International Search Report, with English translation, corresponding to International Application No. PCT/KR2019/006596 dated Sep. 11, 2019.

Written Opinion, with English translation, corresponding to International Application No. PCT/KR2019/006596, dated Sep. 11, 2019.

* cited by examiner

METHOD OF MANUFACTURING DISPLAY DEVICE INCLUDING LIGHT EMITTING ELEMENT INK HAVING LIGHT EMITTING DISPERSANT

CROSS-REFERENCE TO RELATED APPLICATION(S)

This application is a national entry of International Application No. PCT/KR2019/006596 filed May 31, 2019, which claims priority to and benefits of Korean Patent Application No. 10-2018-0131036 under 35 U.S.C. § 119(a) and § 365(b), filed on Oct. 30, 2018 in the Korean Intellectual Property Office, the entire contents of which are incorporated herein by reference.

BACKGROUND

1. Technical Field

The invention relates to a light emitting element dispersant that can be volatilized even at low temperatures by including functional groups having bonds that are decomposed by a photoreaction, a light emitting element ink including the same, and a method of manufacturing a display device.

2. Description of the Related Art

The importance of a display device has increased with the development of multimedia. Accordingly, various types of display devices such as an organic light emitting display (OLED) and a liquid crystal display (LCD) have been used.

A display device is a device for displaying an image, and includes a display panel such as a light emitting display panel or a liquid crystal panel. Among them, the light emitting display panel may include light emitting elements such as light emitting diodes (LEDs). Light emitting diodes (LEDs) may include an organic light emitting diode (OLED) using an organic material as a fluorescent material and an inorganic light emitting diode using an inorganic material as a fluorescent material.

In the case of an organic light emitting diode (OLED), there is an advantage in that its manufacturing process is simple, and it has flexible characteristics because it uses an organic material as a fluorescent material. However, it is known that the organic material is vulnerable to high-temperature driving environments and has a relatively low efficiency of blue light.

In the case of an inorganic light emitting diode, there is an advantage that it has durability even in high-temperature environments and has higher efficiency of blue light than an organic light emitting diode because it uses an inorganic semiconductor as a fluorescent material. In the manufacturing process that has been pointed out as a limitation of a conventional inorganic light emitting diode, transcription methods using dielectrophoresis (DEP) have been developed. Therefore, research continues on inorganic light emitting diodes having higher durability and efficiency than organic light emitting diodes.

SUMMARY

The invention provides a light emitting element dispersant that includes photodegradable functional groups to form molecules having small molecular weight by decomposing bonds when irradiated with light.

The invention provides a method of manufacturing a display device, in which a light emitting element ink forming foreign matter is removed by heat treatment at a low temperature by using a light emitting element ink containing the light emitting element dispersant.

It should be noted that objects of the disclosure are not limited to the above-mentioned object; and other objects of the invention will be apparent to those skilled in the art from the following descriptions.

According to the disclosure, a method of manufacturing a display device comprises: spraying an ink including a solvent, light emitting elements, and a light emitting element dispersant onto a target substrate provided with a first electrode and a second electrode, applying a voltage to the first electrode and the second electrode to generate an electric field on the target substrate, irradiating the ink sprayed on the target substrate with light to form a dispersant fragment in which the light emitting element dispersant is decomposed, and removing the solvent and the dispersant fragment of the ink.

The light emitting element dispersant may include at least one first functional group, at least one second functional group having a different polarity from the first functional group, and a photodegradable functional group to which at least one of the first functional group and the second functional group is bonded.

In the forming of the dispersant fragment, in the light emitting element dispersant, at least one bond of the photodegradable functional group may be decomposed by the applied light.

The removing of the solvent and the dispersant fragment may include heat-treating the ink sprayed on the target substrate to volatilize the solvent and the dispersant fragment.

The heat treatment may be performed in a temperature range of 100° C. to 200° C.

The light emitting element dispersant may have a molecular weight in a range of 500 g/mol to 800 g/mol, and the dispersant fragment may have a boiling point in a temperature range of 100° C. to 200° C.

The light emitting element dispersant may be a compound represented by one of Chemical Structural Formulas 1 to 4:

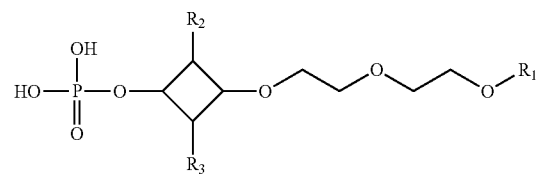

[Chemical Structural Formula 1]

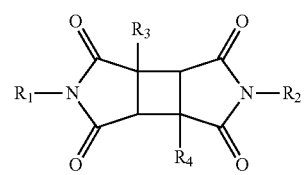

[Chemical Structural Formula 2]

-continued

[Chemical Structural Formula 3]

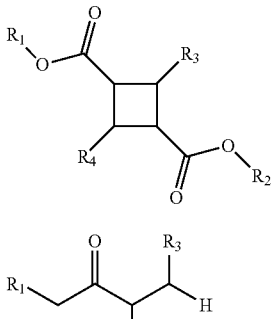

[Chemical Structural Formula 4]

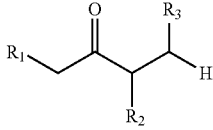

In Chemical Structural Formulas 1 to 4, $R_1$, $R_2$, $R_3$, and $R_4$ may each independently be one of an alkyl group of $C_1$-$C_{10}$, an alkenyl group of $C_2$-$C_{10}$, an alkynyl group of $C_2$-$C_{10}$, an alkyl ether group of $C_1$-$C_{10}$, and an alkenyl ether group of $C_2$-$C_{10}$.

The light emitting element may include a semiconductor crystal core and an insulating material layer formed to surround the outer surface of the semiconductor crystal core, and the insulating material layer and the solvent may have different polarities from each other.

At least a part of the light emitting element dispersant may surround the outer surface of the light emitting element in the solvent to form a dispersion structure, and the dispersion structure may orient the first functional group of the light emitting element dispersant toward the center of the dispersion structure, and may orient the second functional group of the light emitting element dispersant toward the outside of the dispersion structure.

In the generating of the electric field, the light emitting elements may be aligned between the first electrode and the second electrode by the electric field generated on the target substrate.

According to the disclosure, a light emitting element dispersant may comprise at least one first functional group, at least one second functional group having an opposite polarity to the first functional group, and a photodegradable functional group to which at least one of the first functional group and the second functional group is bonded, wherein the light emitting element dispersant may be represented by one of Structural Formulas 1 to 3:

X-P-Y  [Structural Formula 1]

P-X-Y  [Structural Formula 2]

P-Y-X  [Structural Formula 3]

In structural Formulas 1 to 3, P is the photodegradable functional group, X is the first functional group, and Y is the second functional group.

At least one of the first functional group and the second functional group may include a hydrophilic functional group, and the other thereof may include a hydrophobic functional group.

In the light emitting element dispersant, at least one bond of the photodegradable functional group may be decomposed by applied light to form a dispersant fragment.

The photodegradable functional group may include at least one of a cyclobutyl group, a maleicimide dimer group, an acrylate dimer group, and a carbonyl group.

The light emitting element dispersant may have a molecular weight in a range of 500 g/mol to 800 g/mol, and the dispersant fragment may have a boiling point in a temperature range of 100° C. to 200° C.

The light emitting element dispersant may be a compound represented by one of Chemical Structural Formulas 1 to 4:

[Chemical Structural Formula 1]

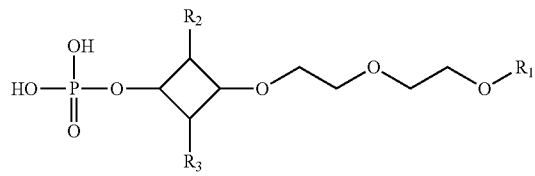

[Chemical Structural Formula 2]

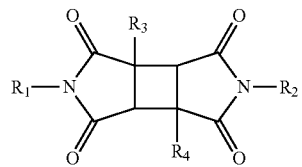

[Chemical Structural Formula 3]

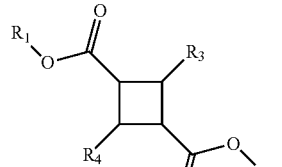

[Chemical Structural Formula 4]

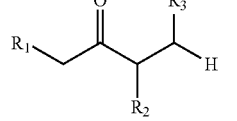

In Chemical Structural Formulas 1 to 4, $R_1$, $R_2$, $R_3$, and $R_4$ may each independently be one of an alkyl group of $C_1$-$C_{10}$, an alkenyl group of $C_2$-$C_{10}$, an alkynyl group of $C_2$-$C_{10}$, an alkyl ether group of $C_1$-$C_{10}$, and an alkenyl ether group of $C_2$-$C_{10}$.

According to the disclosure, a light emitting element ink may comprise a solvent, light emitting elements each including a semiconductor crystal and an insulating material layer surrounding an outer peripheral surface of the semiconductor crystal and dispersed in the solvent, and a light emitting element dispersant dispersing the light emitting elements in the solvent and including a photodegradable functional group having at least one bond that is decomposed by applied light.

The light emitting element dispersant may further include at least one hydrophilic functional group and at least one hydrophobic functional group, and the photodegradable functional group may be bonded to at least one of the hydrophilic functional group and the hydrophobic functional group.

At least a part of the light emitting element dispersant may surround the outer surface of the light emitting element in the solvent to form a dispersion structure, and the dispersion structure may orient the hydrophilic functional group of the light emitting element dispersant toward the center of the dispersion structure, and may orient the hydrophobic functional group of the light emitting element dispersant toward the outside of the dispersion structure.

The semiconductor crystal may include a first conductive semiconductor doped with a first conductive impurity, a second conductive semiconductor doped with a second conductive impurity having a different polarity from the first conductive impurity, and an active layer formed between the first conductive semiconductor and the second conductive semiconductor.

The above and other features and advantages of the invention will become more apparent by describing in detail embodiments thereof with reference to the attached drawings.

A light emitting element dispersant according to an embodiment may include photodegradable functional groups having at least one bond that is decomposed by a photoreaction when irradiated with light, and may thus be decomposed into molecules having small molecular weight. Accordingly, when manufacturing a display device, ink capable of forming foreign matter may be removed by heat treatment at a low temperature.

The effects of the invention are not limited to the above-described effects, and other effects will be clearly understood to those skilled in the art from the description of claims.

DETAILED DESCRIPTION OF THE EMBODIMENTS

Figure 1:
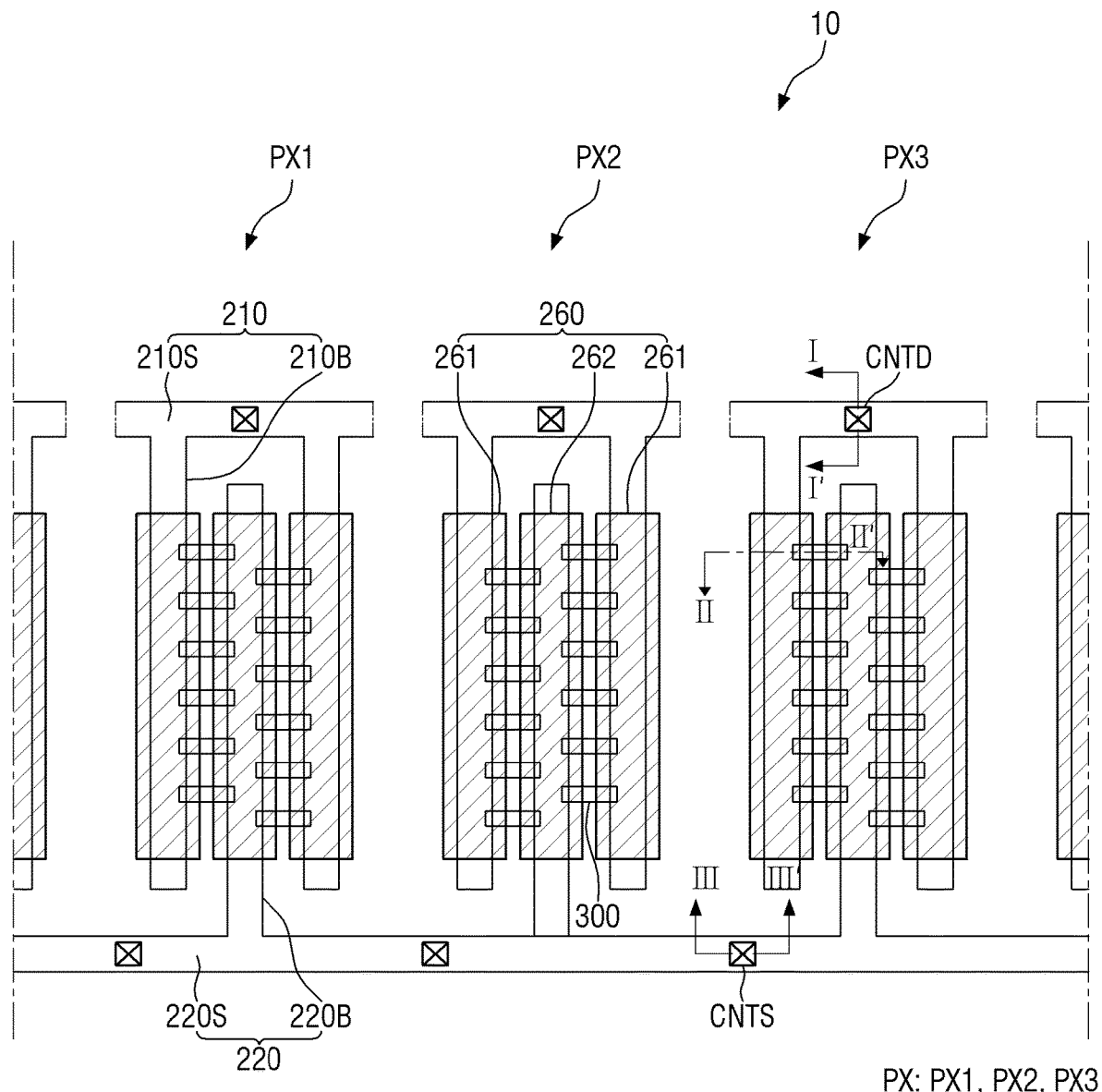
FIG. 1 is a plan view of a display device according to an embodiment.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will be understood that when an element (or a region, a layer, a portion, etc.) is referred to as being "on," "connected to," or "coupled to" another element, it can be disposed on/connected to/coupled to the other element, or that one or more elements may be disposed therebetween.

The same reference numbers indicate the same components throughout the specification. In the drawings, the thickness, the ratio, and the dimensions of elements may be exaggerated for an effective description of technical contents. Therefore, as the sizes and thicknesses of components in the drawings may be arbitrarily illustrated for convenience of explanation, the following embodiments of the disclosure are not limited thereto.

As used herein, the expressions used in the singular such as "a," "an," and "the" are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

In addition, terms such as "below," "lower," "above," "upper," and the like are used to describe the relationship of the configurations shown in the drawings. The terms are used as a relative concept and are described with reference to the direction indicated in the drawings.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, 10%, or 5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the invention will be described in detail with reference to the accompanying drawings.

FIG. 1 is a plan view of a display device according to an embodiment.

Referring to FIG. 1, a display device 10 may include at least one region defined as a pixel PX. Pixels PX each may emit light of a specific wavelength band to the outside of the display device 10. Although FIG. 1 illustrates three pixels PX1, PX2, and PX3, it is obvious that the display device 10 includes a larger number of pixels. Although the drawings show pixels PX arranged only in one direction, for example, in a first direction D1, the pixels PX may be arranged in a second direction D2 intersecting the first direction D1. Further, the pixels PX shown in FIG. 1 may be divided into multiple pixels to allow each of the pixels to constitute one pixel PX. The pixels PX may be arranged in a vertical direction (or second direction D2) or may be arranged in a zigzag form, instead of being arranged only in the first direction D1 in parallel as shown in FIG. 1.

Although not shown in the drawings, the display device 10 includes a display area and a non-display area. The display area is provided with pixels PX, and electrodes 210 and 220 and a light emitting element 300 therebetween may be aligned in each of the pixels PX. Accordingly, in the display area, the light emitting element 300 may display light of a specific color to the outside of the display device 10.

The non-display area is not provided with the pixels PX, and may be defined as an area other than the display area in the display device 10. The non-display area may be covered by specific members not to be viewed from the outside of the display device 10. The non-display area may be provided with various members for driving the light emitting elements 300 arranged in the display area. For example, the non-display area may be provided with a wiring for applying an electrical signal to the display area, a circuit unit, a driving unit, and the like. However, the invention is not limited thereto.

Each of the pixels PX may include at least one light emitting element 300 emitting light of a specific wavelength band to display a color.

In an embodiment, the pixels PX expressing different colors from each other may include light emitting elements 300 emitting light of different colors from each other, respectively. For example, the first pixel PX1 expressing a red color may include a light emitting element 300 emitting red light, the second pixel PX2 expressing a green color may include a light emitting element 300 emitting green light, and the third pixel PX3 expressing a blue color may include a light emitting element 300 emitting blue light. However, the invention is not limited thereto, and in an embodiment, pixels PX expressing different colors from each other may include light emitting elements 300 emitting light of the same color (for example, blue), and the colors of the respective pixels PX may be expressed by providing a wavelength conversion layer or a color filter on a light emitting path. In an embodiment, adjacent pixels PX may emit light of the same color.

The display device 10 may include electrodes 210 and 220 and light emitting elements 300. At least a part of the each of the electrodes 210 and 220 may be disposed in each pixel PX, electrically connected to the light emitting elements 300, and apply electrical signals to the light emitting elements to allow the light emitting elements to emit light of a specific color.

Further, at least a part of the each of the electrodes 210 and 220 may be used to generate an electric field in the pixel PX in order to align the light emitting elements 300. For example, when aligning the light emitting elements 300 in the pixels PX, it is required to accurately align the light emitting elements 300 between the respective electrodes 210 and 220 in each pixel PX. For example, when aligning the light emitting elements 300 using dielectrophoresis, a solution containing the light emitting elements 300 is sprayed onto the display device 10, an AC power is applied to the solution to form a capacitance caused by an electric field, and thus the light emitting elements 300 may be aligned by a dielectrophoretic force.

The solution containing the light emitting elements 300 may be volatilized by aligning the light emitting elements 300 and performing a heating process or a predetermined treatment process. However, since the light emitting elements 300 have a higher specific gravity than the solution, a dispersant is added to the solution so that the light emitting elements 300 can be dispersed in the solution for a predetermined time. This dispersant may be a compound having a relatively high molecular weight so as to disperse the light emitting elements 300 having a large specific gravity in the solution. Accordingly, this dispersant is not easily removed after alignment of the light emitting elements 300 and remains on the light emitting elements 300, and may act as foreign matter in a subsequent process.

According to an embodiment, a light emitting element ink 1000 (shown in FIG. 4) includes a light emitting element dispersant 700 for dispersing the light emitting elements 300 in a solvent S, and the light emitting element dispersant 700 may include a photodegradable functional group 730 in which at least one bond is decomposed by light irradiation. When manufacturing the display device 10, the light emitting element dispersant 700 may be decomposed and easily thus removed at a relatively low temperature by performing a process of applying light after aligning the light emitting elements 300. Details thereof will be described later.

The electrodes 210 and 220 may include a first electrode 210 and a second electrode 220. In an embodiment, the first electrode 210 may be a pixel electrode separated for each pixel PX, and the second electrode 220 may be a common electrode connected in common along the pixels PX. Any one of the first electrode 210 and the second electrode 220 may be an anode electrode of the light emitting element 300, and the other thereof may be a cathode electrode of the light emitting element 300. However, the invention is not limited to this case, and may have an opposite case.

The first electrode 210 and the second electrode 220 may include electrode stem portion 210S and 220S extending in a first direction D1 and electrode branch portions 210B and 220B extending in a second direction D2 intersecting the first direction D1 and branched from the electrode stem portions 210S and 220S, respectively.

For example, the first electrode 210 may include a first electrode stem portion 210S extending in the first direction D1 and at least one first electrode branch portion 210B branched from the first electrode stem portion 210S and extending in the second direction D2. Although not shown in the drawings, one end of the first electrode stem portion 210S may be connected to a signal application pad, and the other end thereof may extend in the first direction D1 but electrically separated between the pixels PX. The signal application pad may be connected to the display device 10 or an external power source to apply an electrical signal to the first electrode stem portion 210S or apply an alignment signal thereto at the time of aligning the light emitting elements 300.

The first electrode stem portion 210S of any one pixel is placed on substantially the same line as the first electrode stem portion 210S of a neighboring pixel belonging to the same row (for example, adjacent in the first direction D1). For example, the first electrode stem portion 210S of one pixel is terminated with both ends thereof being spaced apart from each other between the pixels PX, whereas the first electrode stem portion 210S of the neighboring pixel may be aligned with the extension line of the first electrode stem portion 210S of the one pixel.

Such an arrangement of the first electrode stem portions 210S may be performed by forming one stem electrode during a manufacturing process, performing a process of aligning the light emitting elements 300, and disconnecting the stem electrode using a laser. Accordingly, the first electrode stem portion 210S disposed in each pixel PX may apply different electrical signals from each other to the respective first electrode branch portions 210B, and the respective first electrode branch portions 210B may be driven separately from each other.

The first electrode branch portion 210B may be branched from at least a part of the first electrode stem portion 210S and extended in the second direction D2, but may be terminated by being spaced apart from the second electrode stem portion 220S disposed to face the first electrode stem portion 210S. For example, one end of the first electrode branch portion 210B may be connected to the first electrode stem portion 210S, and the other end thereof may be disposed in the pixel PX spaced apart from the second electrode stem portion 220S. Since the first electrode branch portion 210B is connected to the first electrode stem portion 210S electrically separated for each pixel PX, the first electrode branch portion 210B may receive different electrical signals from each other for each pixel PX.

Further, one or more first electrode branch portions 210B may be disposed for each pixel PX. Although it is shown in FIG. 1 that two first electrode branch portions 210B are disposed and the second electrode branch portion 220B is disposed therebetween, the invention is not limited thereto, and a larger number of first electrode branch portions 210B may be disposed. The first electrode branch portions 210B may be alternately spaced apart from the second electrode branch portions 220B, and light emitting elements 300 may be disposed therebetween. In some embodiments, the second electrode branch portion 220B may be disposed between the first electrode branch portions 210B, so that each pixel PX may have a symmetrical structure with respect to the second electrode branch portion 220B. However, the invention is not limited thereto.

The second electrode 220 may include a second electrode stem portion 220S extending in the first direction D1, spaced apart from the first electrode stem portion 210S and facing the first electrode stem portion 210S and at least one second electrode branch portion 220B branched from the second electrode stem portion 220S, extending in the second direction D2, spaced apart from the first electrode branch portion 210B and facing the first electrode branch portion 210B. Like the first electrode stem portion 210S, one end of the second electrode stem portion 220S may also be connected to a signal application pad (not shown). However, the other end of the second electrode stem portion 220S may extend to the pixels PX adjacent in the first direction D1. For example, the second electrode stem portion 220S may be electrically connected between the pixels PX. Accordingly, both ends of the second electrode stem portion 220S of any one pixel may be connected to one end of the second electrode stem portion 220S of a neighboring pixel PX between the respective pixels PX, so that the same electrical signal may be applied to the respective pixels PX.

The second electrode branch portion 220B may be branched from at least a part of the second electrode stem portion 220S and extended in the second direction D2, but may be terminated by being spaced apart from the first electrode stem portion 210S. For example, one end of the second electrode branch portion 220B may be connected to the second electrode stem portion 220S, and the other end thereof may be disposed in the pixel PX spaced apart from the first electrode stem portion 210S. Since the second electrode branch portion 220B is connected to the second electrode stem portion 220S electrically connected for each pixel PX, the second electrode branch portion 220B may receive the same electrical signal for each pixel PX.

Further, the second electrode branch portion 220B may be disposed to be spaced apart from the first electrode branch portion 210B and face the first electrode branch portion 210B. Since the first electrode stem portion 210S and the second electrode stem portion 220S are spaced apart from each other and face each other in directions opposite to each other with respect to the center of each pixel PX, the first electrode branch portion 210B and the second electrode branch portion 220B may extend in directions opposite to each other. In other words, the first electrode branch portion 210B extends in one direction of the second direction D2, and the second electrode branch portion 220B extends in the other direction of the second direction D2, so that one ends of the respective branch portions may be disposed in directions opposite to each other with respect to the center of the pixel PX. However, the invention is not limited thereto, and the first electrode stem portion 210S and the second electrode stem portion 220S may be disposed to be spaced apart from each other in the same direction with respect to the center of the pixel PX. The first electrode branch portion 210B and the second electrode branch portion 220B, respectively branched from the first electrode stem portion 210S and the second electrode stem portion 220S, may extend in the same direction.

Although it is shown in FIG. 1 that one second electrode branch portion 220B is disposed in each pixel PX, the invention is not limited thereto, and a larger number of second electrode branch portions 220B may be disposed.

Light emitting elements 300 may be arranged between the first electrode branch portion 210B and the second electrode branch portion 220B. One ends of at least some of the light emitting elements 300 may be electrically connected to the first electrode branch portion 210B, and the other ends thereof may be electrically connected to the second electrode branch portion 220B.

The light emitting elements 300 may be spaced from each other in the second direction D2 and may be aligned substantially parallel to each other. The interval between the light emitting elements 300 is not particularly limited. In an embodiment, the light emitting elements 300 may be arranged adjacent to each other to form a group, the light emitting elements 300 may form a group in a state spaced apart at a predetermined interval, and the light emitting elements 300 may have non-uniform density and may be oriented and aligned in one direction.

Although not shown in FIG. 1, a first insulating layer 510 (shown in FIG. 2) may be disposed to partially cover the first electrode branch portion 210B, the second electrode branch portion 220B, and a space therebetween. The first insulating layer 510 may protect the electrodes 210 and 220 and insulate them such that they do not directly contact them. Further, the light emitting elements 300 may be aligned on the first insulating layer 510 in a space where the first electrode branch portion 210B and the second electrode branch portion 220B are spaced apart from each other. Accordingly, the first insulating layer 510 may prevent the light emitting elements 300 from directly contacting other members. Details of the first insulating layer 510 will be described later.

Contact electrodes 260 may be disposed on the first electrode branch portion 210B and the second electrode branch portion 220B, respectively. The contact electrode 260 may be substantially disposed on the first insulating layer 510 not shown in FIG. 1. For example, the contact electrode 260 may be disposed on the first insulating layer 510, and may be disposed to overlap the first electrode branch portion 210B and the second electrode branch portion 220B.

The contact electrodes 260 may be arranged to extend in the second direction D2 and spaced apart from each other in the first direction D1. Each of the contact electrodes 260 may be in contact with at least one end of the light emitting element 300, and may be in contact with the first electrode 210 or the second electrode 220 to receive an electrical signal. The area in which the contact electrode 260 is in contact with the first electrode 210 or the second electrode 220 is an area in which the first insulating layer 510 partially covering the first electrode 210 and the second electrode 220 is patterned to expose the first electrode 210 and the second electrode 220. Thus, the contact electrode 260 may transmit electrical signals received from the first electrode 210 and the second electrode 220 to the light emitting element 300.

The contact electrodes 260 may be disposed on the electrode branch portions 210B and 220B to partially cover the electrode branch portions 210B and 220B, and may include a first contact electrode 261 and a second contact electrode 262, each contacting one end or the other end of the light emitting element 300.

The first contact electrode 261 may be disposed on the first electrode branch portion 210B, and may be in contact with one end of the light emitting element 300 electrically connected to the first electrode 210. The second contact electrode 262 may be disposed on the second electrode branch portion 220B, and may be in contact with the other end of the light emitting element 300 electrically connected to the second electrode 220.

In some embodiments, both ends of the light emitting element 300 electrically connected to the first electrode branch portion 210B or the second electrode branch portion 220B may be a conductive semiconductor layer doped with an n-type dopant or a p-type dopant. When one end of the light emitting element 300 electrically connected to the first electrode branch portion 210B is a conductive semiconductor layer doped with a p-type dopant, the other end of the light emitting element 300 electrically connected to the second electrode branch portion 220B may be a conductive semiconductor layer doped with an n-type dopant. However, the invention is not limited thereto, and vice versa.

The first contact electrode 261 and the second contact electrode 262 may be disposed on the first electrode branch portion 210B and the second electrode branch portion 220B to partially cover the first electrode branch portion 210B and the second electrode branch portion 220B, respectively. As shown in FIG. 1, the first contact electrode 261 and the second contact electrode 262 may be disposed to extend in the second direction D2, spaced apart from each other and face each other. However, one end of each of the first contact electrode 261 and the second contact electrode 262 may be terminated to partially expose one end of each of the electrode branch portions 210B and 220B. Further, the other end of each of the first contact electrode 261 and the second contact electrode 262 may be terminated in a state where they are spaced apart from each other so as not to overlap each of the electrode stem portions 210S and 220S. However, the invention is not limited thereto, and the other end of each of the first contact electrode 261 and the second contact electrode 262 may cover each of the electrode branch portions 210B and 220B.

As shown in FIG. 1, the first electrode stem portion 210S and the second electrode stem portion 220S may be electrically connected to a thin film transistor 120 (shown in FIG. 2) or a power supply wiring 161 (shown in FIG. 2), which will each be described later, through contact holes, for example, a first electrode contact hole CNTD and a second electrode contact hole CNTS, respectively. Although it is shown in FIG. 1 that the contact holes on the first electrode stem portion 210S and the second electrode stem portion 220S are arranged for each pixel PX, the invention is not limited thereto. As described above, since the second electrode stem portion 220S may extend to be electrically connected to the adjacent pixel PX, in some embodiments, the second electrode stem portion 220S may be electrically connected to a thin film transistor through one contact hole.

Further, although not shown in FIG. 1, the display device 10 may include a second insulating layer 520 (shown in FIG. 2), a third insulating layer 530 (shown in FIG. 2), and a passivation layer 550 (shown in FIG. 2), which are disposed to cover at least a part of each of the electrodes 210 and 220 and at least a part of the light emitting element 300. The arrangement and structure will be described later with reference to FIG. 2.

Hereinafter, more specific structures of members disposed on the display device 10 will be described with reference to FIG. 2.

Figure 2:
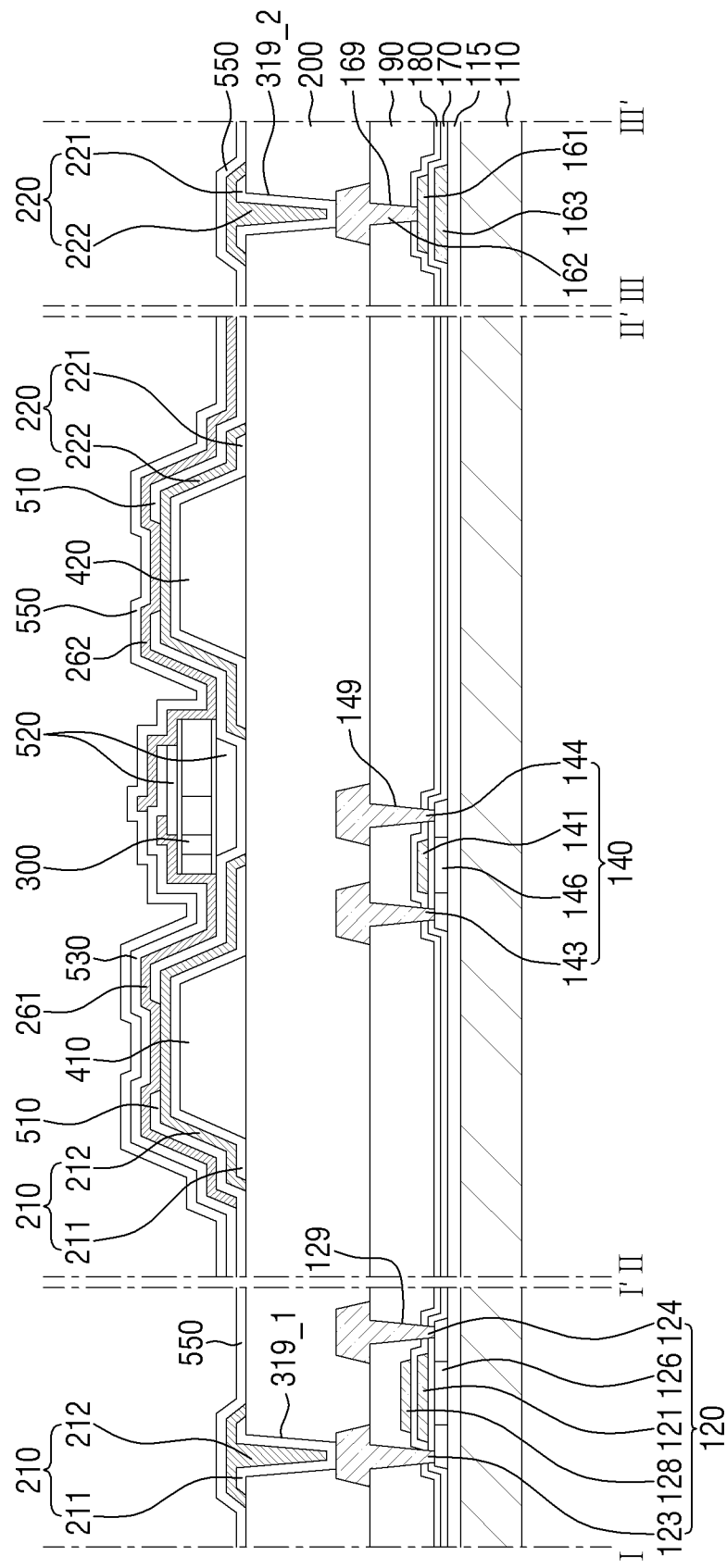
FIG. 2 is a schematic cross-sectional view taken along the lines I-I', and of FIG. 1.

FIG. 2 is a schematic cross-sectional view taken along the lines I-I', and of FIG. 1. Although FIG. 2 shows only one pixel PX, it may be applied to other pixels as well. FIG. 2 shows a cross-section across one end and the other end of a light emitting element 300.

Referring to FIGS. 1 and 2, the display device 10 may include a substrate 110, thin film transistors 120 and 140 disposed on the substrate 110, and electrodes 210 and 220 and a light emitting element 300 disposed over the thin film transistors 120 and 140. The thin film transistors may include a first thin film transistor 120 and a second thin film transistor 140, which may be a driving transistor and a switching transistor, respectively. The thin film transistors 120 and 140 may each include an active layer, a gate electrode, a source electrode, and a drain electrode. The first electrode 210 may be electrically connected to the drain electrode of the first thin film transistor 120.

For example, the substrate 110 may be an insulating substrate. The substrate 110 may be made of an insulating material such as glass, quartz, or a polymer resin. Examples of the polymer resin may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), and combinations thereof. The substrate 110 may be a rigid substrate, but may be a flexible substrate capable of bending, folding, rolling, or the like.

A buffer layer 115 may be disposed on the substrate 110. The buffer layer 115 may prevent the diffusion of impurity ions, may prevent the penetration of moisture or external air, and may perform a surface planarization function. The buffer layer 115 may include silicon nitride, silicon oxide, or silicon oxynitride.

A semiconductor layer is disposed on the buffer layer 115. The semiconductor layer may include a first active layer 126 of the first thin film transistor 120, a second active layer 146 of the second thin film transistor 140, and an auxiliary layer 163. The semiconductor layer may include polycrystalline silicon, monocrystalline silicon, an oxide semiconductor, or the like.

A first gate insulating layer 170 is disposed on the semiconductor layer. The first gate insulating layer 170 covers the semiconductor layer. The first gate insulating layer 170 may function as a gate insulating film of the thin film transistor. The first gate insulating layer 170 may include silicon oxide, silicon nitride, silicon oxynitride, aluminum oxide, tantalum oxide, hafnium oxide, zirconium oxide, titanium oxide, or the like. These compounds may be used alone or in combination with each other.

A first conductive layer is disposed on the first gate insulating layer 170. The first conductive layer may include a first gate electrode 121 disposed on the first active layer 126 of the first thin film transistor 120, a second gate electrode 141 disposed on the second active layer 146 of the second thin film transistor 140, and a power supply wiring 161 disposed on the auxiliary layer 163, with the first gate insulating layer 170 therebetween. The first conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer may be a single-layer film or a multilayer film.

A second gate insulating layer 180 is disposed on the first conductive layer. The second gate insulating layer 180 may be an interlayer insulating film. The second gate insulating layer 180 may include an inorganic insulating material such as silicon oxide, silicon nitride, silicon oxynitride, hafnium oxide, aluminum oxide, titanium oxide, tantalum oxide, or zinc oxide.

A second conductive layer is disposed on the second gate insulating layer 180. The second conductive layer includes a capacitor electrode 128 disposed on the first gate electrode 121 with the second gate insulating layer 180 therebetween. The capacitor electrode 128 may constitute a storage capacitor together with the first gate electrode 121.

Like the first conductive layer, the second conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

An interlayer insulating layer 190 is disposed on the second conductive layer. The interlayer insulating layer 190 may be an interlayer insulating film. Moreover, the interlayer insulating layer 190 may perform a surface planarization function. The interlayer insulating layer 190 may include an organic insulating material such as a polyacrylate resin, an epoxy resin, a phenolic resin, a polyamide resin, a polyimide rein, an unsaturated polyester resin, a polyphenyleneether resin, a polyphenylenesulfide resin, or benzocyclobutene (BCB).

A third conductive layer is disposed on the interlayer insulating layer 190. The third conductive layer includes a first drain electrode 123 and first source electrode 124 of the first thin film transistor 120, a second drain electrode 143 and second source electrode 144 of the second thin film transistor 140, and a power supply electrode 162 disposed on the power supply wiring 161.

Each of the first source electrode 124 and the first drain electrode 123 may be electrically connected to the first active layer 126 through a first contact hole 129 penetrating the interlayer insulating layer 190 and the second gate insulating layer 180. Each of the second source electrode 144 and the second drain electrode 143 may be electrically connected to the second active layer 146 through a second contact hole 149 penetrating the interlayer insulating layer 190 and the second gate insulating layer 180. The power supply electrode 162 may be electrically connected to the power supply wiring 161 through a third contact hole 169 penetrating the interlayer insulating layer 190 and the second gate insulating layer 180.

The third conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer may be a single-layer film or a multilayer film. For example, the third conductive layer may be formed of a laminate structure of Ti/Al/Ti, Mo/Al/Mo, Mo/AlGe/Mo, or Ti/Cu.

A via layer 200 is disposed on the third conductive layer. The via layer 200 may include an organic insulating material such as a polyacrylate resin, an epoxy resin, a phenolic resin, a polyamide resin, a polyimide rein, an unsaturated polyester resin, a polyphenyleneether resin, a polyphenylenesulfide resin, or benzocyclobutene (BCB). The surface of the via layer 200 may be flat.

Banks 410 and 420 may be disposed on the via layer 200. The banks 410 and 420 are disposed to be spaced apart from each other and face each other in each of the pixels PX, and the first electrode 210 and the second electrode 220 may be disposed on the banks 410 and 420 spaced apart from each other, for example, a first bank 410 and a second bank 420. FIG. 1 shows a case where three banks 410 and 420, specifically, two first banks 410 and one second bank 420 are disposed in one pixel PX, and thus two first electrodes 210 and one second electrode 220 are disposed. FIG. 2 shows only a cross-sectional view of one first bank 410 and one second bank 420, and the arrangement structure thereof may be equally applied to other first banks 410 not shown in FIG. 2.

However, the number of banks 410 and 420 is not limited thereto. For example, a larger number of banks 410 and 420 may be disposed in one pixel PX, and thus a larger number of first and second electrodes 210 and 220 may be disposed. The banks 410 and 420 may include at least one first bank 410 on which the first electrode 210 is disposed, and at least one second bank 420 on which the second electrode 220 is disposed. The first bank 410 and the second bank 420 may be disposed to be spaced apart from each other and face each other, and the banks may be alternately arranged in one direction. In some embodiments, two first banks 410 may be disposed to be spaced apart from each other, and one second bank 420 may be disposed between the spaced first banks 410.

Further, although not shown in FIG. 2, as described above, the first electrode 210 and the second electrode 220 may include the electrode stem portions 210S and 220S and the electrode branch portions 210B and 220B, respectively. It may be understood that the first electrode branch portion 210B and the second electrode branch portion 220B are disposed on the first bank 410 and the second bank 420, respectively.

The banks 410 and 420 may be substantially made of a same material, and thus may be formed in one process. The banks 410 and 420 may form one lattice pattern. The banks 410 and 420 may include polyimide (PI).

Although not shown in the drawings, at least some of the banks 410 and 420 may be disposed at the boundary between the respective pixels PX to distinguish them from each other. The electrodes 210 and 220 may not be disposed on the banks 410 and 420 disposed at the boundary between the respective pixels PX. These banks may be arranged in a substantially lattice pattern together with the first bank 410 and second bank 420 described above. At least some of the banks 410 and 420 disposed at the boundary between the respective pixels PX may be disposed to cover the electrode lines of the display device 10.

Each of the banks 410 and 420 may have a structure in which at least a part thereof protrudes from the via layer 200. Each of the banks 410 and 420 may protrude upward with respect to a plane on which the light emitting element 300 is disposed, and at least a part of the protruding portion may have an inclination. Each of the banks 410 and 420 protruding with an inclination may reflect light incident on reflective layers 211 and 221 disposed thereon. Light directed from the light emitting element 300 to the reflective layers 211 and 221 may be reflected and transmitted to an outside of the display device 10, for example, above the banks 410 and 420. The shape of each of the protruded banks 410 and 420 is not particularly limited. Although it is shown in FIG. 2 that each of the banks 410 and 420 has a protruding structure having an angled corner shape in which both side surfaces are flat and one upper side is flat, the invention is not limited thereto, and each of the banks 410 and 420 may have a structure protruding in a curved shape.

The reflective layers 211 and 221 may be disposed on the banks 410 and 420.

The first reflective layer 211 covers the first bank 410, and a part thereof is electrically connected to the first drain electrode 123 of the first thin film transistor 120 through a fourth contact hole 319_1 penetrating the via layer 200. The second reflective layer 221 covers the second bank 420, and a part thereof is electrically connected to the power supply electrode 162 through a fifth contact hole 319_2 penetrating the via layer 200.

The first reflective layer 211 may be electrically connected to the first drain electrode 123 of the first thin film transistor 120 through the fourth contact hole 319_1 in the pixel PX. Therefore, the first thin film transistor 120 may be disposed in a region overlapping the pixel PX. It is shown in FIG. 1 that the first reflective layer 211 is electrically connected to the first thin film transistor 120 through the first electrode contact hole CNTD disposed on the first electrode stem portion 210S. For example, the first electrode contact hole CNTD may be the fourth contact hole 319_1.

The second reflective layer 221 may also be electrically connected to the power supply electrode 162 through the fifth contact hole 319_2 in the pixel PX. It is shown in FIG. 2 that the second reflective layer 221 is electrically connected to the power supply electrode 162 through the fifth contact hole 319_2 in one pixel PX. It is shown in FIG. 1 that the second electrode 220 of each pixel PX is electrically connected to the power supply wiring 161 through the second electrode contact holes CNTS on the second electrode stem portion 220S. For example, the second electrode contact hole CNTS may be the fifth contact hole 319_2.

As described above, in FIG. 1, the first electrode contact hole CNTD and the second electrode contact hole CNTS are disposed on the first electrode stem portion 210S and the second electrode stem portion 220S, respectively. Accordingly, it is shown in FIG. 2 that, in the cross-sectional view of the display device 10, the first electrode 210 and the second electrode 220 are electrically connected to the first thin film transistor 120 or the power supply wiring 161 through the fourth contact hole 319_1 and the fifth contact hole 319_2, respectively, in a region spaced apart from the banks 410 and 420 where the first electrode branch portion 210B and the second electrode branch portion 220B are disposed.

However, the invention is not limited thereto. For example, in FIG. 1, the second electrode contact hole CNTS may be disposed at various positions even on the second electrode stem portion 220S, and in an embodiment, the second electrode contact hole CNTS may be disposed on the second electrode branch portion 220B. Further, in some embodiments, the second reflective layer 221 may be connected to one second electrode contact hole CNTS or one fifth contact hole 319_2 in a region other than the pixel PX.

In some embodiments, in the second electrode 220, the second electrode stem portion 220S may be electrically connected to the power supply electrode 162 through one second electrode contact hole CNTS in the non-display area located at the outside of the display device 10. Since the second electrode stem portion 220S is extended to the adjacent pixel PX and is electrically connected to the adjacent pixel PX, the same electric signal may be applied to the second electrode branch portion 220B of each pixel PX.

Each of the reflective layers 211 and 221 may include a high-reflectance material to reflect the light emitted from the light emitting element 300. For example, each of the reflective layers 211 and 221 may include a material such as silver (Ag) or copper (Cu), but the invention is not limited thereto.

A first electrode layer 212 and a second electrode layer 222 may be disposed on the first reflective layer 211 and the second reflective layer 221, respectively.

The first electrode layer 212 is disposed directly on the first reflective layer 211. The first electrode layer 212 may have substantially the same pattern as the first reflective layer 211. The second electrode layer 222 is disposed directly on the second reflective layer 221 and spaced apart from the first electrode layer 212. The second electrode layer 222 may have substantially the same pattern as the second reflective layer 221.

In an embodiment, the electrode layers 212 and 222 may cover the underlying reflective layers 211 and 221, respectively. For example, the electrode layers 212 and 222 may be formed to be larger than the reflective layers 211 and 221 to cover the side surfaces of ends of the reflective layers 211 and 221. However, the invention is not limited thereto.

The first electrode layer 212 and the second electrode layer 222 may transmit the electric signals transmitted to the first reflective layer 211 and second reflective layer 221 connected to the first thin film transistor 120 or the power supply electrode 162 to contact electrodes 261 and 262 to be described later.

The electrode layers 212 and 222 may include a transparent conductive material. For example, the electrode layers 212 and 222 may include a material such as indium tin oxide (ITO), indium zinc oxide (IZO), or indium tin-zinc oxide (ITZO), but the invention is not limited thereto. In some embodiments, the reflective layers 211 and 221 and the electrode layers 212 and 222 may have a structure in which a transparent conductive layer such as ITO, IZO, or ITZO and a metal layer such as silver or copper are laminated as one or more layers. For example, the reflective layers 211 and 221 and the electrode layers 212 and 222 may have a laminate structure of ITO/silver (Ag)/ITO.

The first reflective layer 211 and the first electrode layer 212, which are disposed on the first bank 410, constitute the first electrode 210. The first electrode 210 may protrude to a region extending from both ends of the first bank 410, and thus the first electrode 210 may be in contact with the via layer 200 in the protruding region. The second reflective layer 221 and the second electrode layer 222, which are disposed on the second bank 420, constitute the second electrode 220. The second electrode 220 may protrude to a region extending from both ends of the second bank 420, and thus the second electrode 220 may be in contact with the via layer 200 in the protruding region.

The first electrode 210 and the second electrode 220 may be disposed to cover the entire region of the first bank 410 and the entire region of the second bank 420, respectively. However, as described above, the first electrode 210 and the second electrode 220 are spaced apart from each other and face each other. As will be described later, a first insulating layer 510 may be disposed between the first electrode 210 and second electrode 220 spaced apart from each other, and the light emitting element 300 may be disposed on the first insulating layer 510.

Further, the first reflective layer 211 may receive a driving voltage from the first thin film transistor 120, and the second reflective layer 221 may receive a power supply voltage from the power supply wiring 161, so that the first electrode 210 and the second electrode 220 receive a driving voltage and a power supply voltage, respectively. The first electrode 210 may be electrically connected to the first thin film transistor 120, and the second electrode 220 may be electrically connected to the power supply wiring 161. Accordingly, the first contact electrode 261 and the second contact electrode 262 disposed on the first electrode 210 and the second electrode 220, respectively, may receive the driving voltage and the power supply voltage. The driving voltage and the power supply voltage are transmitted to the light emitting element 300, and a predetermined current flows through the light emitting element 300, so as to emit light.

The first insulating layer 510 is disposed on the first electrode 210 and the second electrode 220 to partially cover them. The first insulating layer 510 may be disposed so as to cover most of the upper surfaces of the first electrode 210 and the second electrode 220, and may expose a part of the first electrode 210 and a part of the second electrode 220. The first insulating layer 510 may be disposed in a space between the first electrode 210 and second electrode 220. The first insulating layer 510 may have an island shape or a linear shape formed along a space between the first electrode branch portion 210B and the second electrode branch portion 220B in a plan view.

It is shown in FIG. 2 that the first insulating layer 510 is disposed in a space between one first electrode 210 (for example, the first electrode branch portion 210B) and one second electrode 220 (for example, the second electrode branch portion 220B). However, as described above, since the number of the first electrodes 210 may be plural and the number of the second electrodes 220 may be plural, the first insulating layer 510 may be also disposed between one first electrode 210 and another second electrode 220 or between one second electrode 220 and another first electrode 210. Further, the first insulating layer 510 may be disposed on sides opposite to the facing sides of the first electrode 210 and the second electrode 220 so as to partially cover them. For example, the first insulating layer 510 may be disposed so as to expose the centers of the first electrode 210 and the second electrode 220.

The light emitting element 300 is disposed on the first insulating layer 510. The first insulating layer 510 may be disposed between the light emitting element 300 and the via layer 200. Further, both side surfaces of the first insulating layer 510 may be in contact with the first electrode 210 and the second electrode 220 to electrically insulate them from each other.

The first insulating layer 510 may overlap a part of a region on each of the electrodes 210 and 220, for example, a part of a region protruding in a direction in which the first electrode 210 and the second electrode 220 face each other. The first insulating layer 510 may also be disposed in a region where the inclined side surface and flat upper surfaces of each of the banks 410 and 420 overlap each of the electrodes 210 and 220.

For example, the first insulating layer 510 may cover each end protruding in a direction in which the first electrode 210 and the second electrode 220 face each other. The lower surface of the first insulating layer 510 may be in contact with a part of the via layer 200 and a part of each of the electrodes 210 and 220. Therefore, the first insulating layer 510 may protect the region overlapping each of the electrodes 210 and 220, and electrically insulate them from each other. Further, the first insulating layer 510 may prevent the first conductive semiconductor layer 310 and second conductive semiconductor layer 320 of the light emitting element 300 from being in direct contact with other substrates to prevent damage to the light emitting element 300.

However, the invention is not limited thereto, and the first insulating layer 510 may be disposed only in the region overlapping the inclined surfaces of the banks 410 and 420 among the regions on the first electrode 210 and the second electrode 220. The lower surface of the first insulating layer 510 may terminate at the inclined surface of each of the banks 410 and 420, and each of the electrodes 210 and 220 disposed on a part of the inclined surface of each of the banks 410 and 420 may be exposed to be in contact with the contact electrode 260.

Further, the first insulating layer 510 may be disposed such that both ends of the light emitting element 300 are exposed. Accordingly, the contact electrode 260 may be in contact with the exposed upper surface of each of the electrodes 210 and 220 and both ends of the light emitting element 300, and the contact electrode 260 may transmit an electrical signal applied to the first electrode 210 and the second electrode 220 to the light emitting element 300.

At least one light emitting element 300 may be disposed between the first electrode 210 and the second electrode 220. Although it is shown in FIG. 2 that one light emitting element 300 is disposed between the first electrode 210 and the second electrode 220 in a cross-section, it is obvious that, as shown in FIG. 1, the light emitting elements 300 may be arranged in a different direction (for example, second direction D2) on a plane.

For example, one end of the light emitting element 300 may be electrically connected to the first electrode 210, and the other end thereof may be electrically connected to the second electrode 220. Both ends of the light emitting element 300 may be in contact with the first contact electrode 261 and the second contact electrode 262, respectively.

Although it is illustrated in FIG. 1 that only the light emitting elements 300 emitting light of the same color are arranged in each pixel PX, the invention is not limited thereto. As described above, the light emitting elements 300 emitting light of different colors from each other may be arranged within one pixel PX.

The light emitting element 300 may be a light emitting diode. The light emitting element 300 may be a nanostructure having a size that is generally on a nanometer scale. The light emitting element 300 may be an inorganic light emitting diode including an inorganic material. In the case where the light emitting element 300 is an inorganic light emitting diode, when a light emitting material having an inorganic crystal structure is disposed between two electrodes facing each other and an electric field is generated in the light emitting material in a specific direction, the inorganic light emitting diode may be aligned between the two electrodes in which a specific polarity is formed.

The light-emitting element 300 may have a shape extending in one direction. The shape of the light emitting element 300 may be a nanorod, a nanowire, a nanotube, or the like.

In an embodiment, the light emitting element 300 may be a semiconductor nanorod in which one end is doped with a first conductive impurity and the other end is doped with a second conductive impurity having a polarity different from that of the first conductive impurity. The light emitting element 300 may include a first conductive semiconductor layer 310, an element active layer 330, a second conductive semiconductor layer 320, and an electrode material layer 370, which are sequentially laminated, and an insulating material layer 380 surrounding an outer peripheral surface of these layers.

In the light emitting element 300, the first conductive semiconductor layer 310, the element active layer 330, the second conductive semiconductor layer 320, and the electrode material layer 370 are arranged in a direction horizontal to the via layer 200. For example, the light emitting element 300, in which the layers are formed, may be disposed in a horizontal direction horizontal to the via layer 200. However, the invention is not limited thereto, and the light emitting element 300 may be aligned such that the aforementioned laminating direction is reversed between the first electrode 210 and the second electrode 220.

The second insulating layer 520 may be disposed to overlap at least a part of the region on the light emitting element 300. The second insulating layer 520 may protect the light emitting element 300, and may fix the light emitting element 300 between the first electrode 210 and the second electrode 220.

Although it is shown in FIG. 2 that the second insulating layer 520 is disposed on the upper surface of the light emitting element 300 in a cross-sectional view, the second insulating layer 520 may be disposed to surround the outer surface of the light emitting element 300. For example, like the first insulating layer 510, the second insulating layer 520 may be disposed to extend in the second direction D2 along a space between the first electrode branch portion 210B and the second electrode branch portion 220B so as to have an island shape or a linear shape in a plan view.

Further, a part of the material of the second insulating layer 520 may be disposed even in a region where the lower surface of the light emitting element 300 is in contact with the first insulating layer 510. This configuration may be formed when the light emitting element 300 is aligned on the first insulating layer 510 and the second insulating layer 520 is disposed on the first insulating layer 510 at the time of manufacturing the display device 10. When some voids are formed in the first insulation layer 510 contacting the lower surface of the light emitting element 300, a part of the material of the second insulating layer 520 penetrates into the voids when the second insulating layer 520 is formed, so as to form the configuration.

The second insulating layer 520 is disposed such that both side surfaces of the light emitting element 300 are exposed. For example, since the length of the second insulating layer 520 disposed on the upper surface of the light emitting element 300 in the cross-section, measured in the uniaxial direction, is shorter than the length of the light emitting element 300, the second insulating layer 520 may be recessed inwardly from both side surfaces of the light emitting element 300. The contact electrodes 261 and 262 to be described later may be brought into smooth contact with both ends of the light emitting element 300. However, the invention is not limited thereto, and the length of the second insulating layer 520 may be matched with the length of the light emitting element 300, so that both sides thereof may be aligned with each other.

The second insulating layer 520 may be disposed to cover the first insulating layer 510 and patterned in a region where the light emitting element 300 is exposed to be contact with the contact electrode 260. The process of patterning the second insulating layer 520 may be performed by a general dry etching or wet etching method. In order to prevent the first insulating layer 510 from being patterned, the first insulating layer 510 and the second insulating layer 520 may include materials having different etching selection ratios from each other. In other words, when patterning the second insulating layer 520, the first insulating layer 510 may function as an etching stopper.

Accordingly, even when the second insulating layer 520 covers the outer surface of the light emitting element 300 and is patterned to expose both ends of the light emitting element 300, the material of the first insulating layer 510 is not damaged. For example, the first insulating layer 510 and the light emitting element 300 may form a smooth contact surface at both ends of the light emitting element 300, at which the light emitting element 300 is in contact with the contact electrode 260.

The first contact electrode 261 disposed on the first electrode 210 and overlapping at least a part of the second insulating layer 520, and the second contact electrode 262 disposed on the second electrode 220 and overlapping at least a part of the second insulating layer 520 may be disposed on the second insulating layer 520.

The first contact electrode 261 and the second contact electrode 262 may be disposed on the upper surface of the first electrode 210 and the upper surface of the second electrode 220, respectively. For example, the first contact electrode 261 and the second contact electrode 262 may be in contact with the first electrode layer 212 and the second electrode layer 222, respectively, in the region where the first insulating layer 510 is patterned to expose a part of the first electrode 210 and a part of the second electrode 220. Each of the first contact electrode 261 and the second contact electrode 262 may be in contact with one end side surface of the light emitting element 300, for example, the first conductive semiconductor layer 310, the second conductive semiconductor layer 320, or the electrode material layer 370. Thus, the first contact electrode 261 and the second contact electrode 262 may transmit electrical signals applied to the first electrode layer 212 and the second electrode layer 222 to the light emitting element 300.

The first contact electrode 261 may be disposed on the first electrode 210 to partially cover the first electrode 210, and the lower surface of the first contact electrode 261 may be partially in contact with the light emitting element 300, the first insulating layer 510, and the second insulating layer 520. One end of the first contact electrode 261 in the direction in which the second contact electrode 262 is disposed may be disposed on the second insulating layer 520. The second contact electrode 262 may be disposed on the second electrode 220 to partially cover the second electrode 220, and the lower surface of the second contact electrode 262 may be partially in contact with the light emitting element 300, the first insulating layer 510, and a third insulating layer 530. One end of the second contact electrode 262 in the direction in which the first contact electrode 261 is disposed may be disposed on the third insulating layer 530.

Areas where the first insulating layer 510 and the second insulating layer 520 are disposed to cover the first electrode 210 and the second electrode 220 on the upper surfaces of the first bank 410 and the second bank 420 may be patterned. Accordingly, the first electrode layer 212 of the first electrode 210 and the second electrode layer 222 of the second electrode 220 are exposed to be electrically connected to the contact electrodes 261 and 262, respectively.

The first contact electrode 261 and the second contact electrode 262 may be disposed to be spaced apart from each other on the second insulating layer 520 or the third insulating layer 530. For example, the first contact electrode 261 and the second contact electrode 262 are in contact with the second insulating layer 520 or the third insulating layer 530 together the light emitting element 300, but are spaced apart from each other in a lamination direction on the second insulating layer 520 to be electrically insulated from each other. Accordingly, the first contact electrode 261 and the second contact electrode 262 may receive different powers from the first thin film transistor 120 and the power supply wiring 161. For example, the first contact electrode 261 may receive a driving voltage applied from the first thin film transistor 120 to the first electrode 210, and the second contact electrode 262 may receive a common power supply voltage applied from the power supply wiring 161 to the second electrode 220. However, the invention is not limited thereto.

The contact electrodes 261 and 262 may include a conductive material. For example, the contact electrodes 261 and 262 may include ITO, IZO, ITZO, or aluminum (Al). However, the invention is not limited thereto.

Further, the contact electrodes 261 and 262 may include a same material as the electrode layers 212 and 222. The contact electrodes 261 and 262 may be disposed in a substantially same pattern on the electrode layers 212 and 222 so as to be in contact with the electrode layers 212 and 222. For example, the first contact electrode 261 contacting the first electrode layer 212 and the second contact electrode 262 contacting the second electrode layer 222 may receive electrical signals applied from the first electrode layer 212 and the second electrode layer 222 and transmit the electrical signals to the light emitting element 300.

The third insulating layer 530 may be disposed on the first contact electrode 261 to electrically insulate the first contact electrode 261 and the second contact electrode 262 from each other. The third insulating layer 530 may disposed to cover the first contact electrode 261, but may be disposed not to overlap a part of the light emitting element 300 such that the light emitting element 300 is in contact with the second contact electrode 262. The third insulating layer 530 may partially contact the first contact electrode 261, the second contact electrode 262, and the second insulating layer 520 on the upper surface of the second insulating layer 520. The third insulating layer 530 may be disposed to cover one end of the first contact electrode 261 on the upper surface of the second insulating layer 520. Thus, the third insulating layer 530 may protect the first contact electrode 261 and electrically insulate the first contact electrode 261 and the second contact electrode 262 from each other.

One end of the third insulating layer 530 in the direction in which the second electrode 220 is disposed may be aligned with one side surface of the second insulating layer 520.

In some embodiments, the third insulating layer 530 may be omitted in the display device 10. Accordingly, the first contact electrode 261 and the second contact electrode 262 may be disposed on substantially the same plane, and the first contact electrode 261 and the second contact electrode 262 may be electrically insulated from each other by a passivation layer 550 to be described later.

The passivation layer 550 may be formed on the third insulating layer 530 and the second contact electrode 262 to protect members disposed on the via layer 200 from external environments. When the first contact electrode 261 and the second contact electrode 262 are exposed, a problem of disconnection of a contact electrode material due to electrode damage may occur, so that the passivation layer 550 may cover these members. For example, the passivation layer 550 may be disposed to cover the first electrode 210, the second electrode 220, the light emitting element 300, and the like. As described above, when the third insulating layer 530 is omitted, the passivation layer 550 may be formed on the first contact electrode 261 and the second contact electrode 262. The passivation layer 550 may electrically insulate the first contact electrode 261 and the second contact electrode 262 from each other.

Each of the aforementioned first insulating layer 510, second insulating layer 520, third insulating layer 530, and passivation layer 550 may include an inorganic insulating material. For example, the first insulating layer 510, the second insulating layer 520, the third insulating layer 530, and the passivation layer 550 may include an inorganic insulating material such as silicon oxide (SiOx), silicon nitride (SiNx), silicon oxynitride (SiOxNy), aluminum oxide ($Al_2O_3$), or aluminum nitride (AlN). The first insulating layer 510, the second insulating layer 520, the third insulating layer 530, and the passivation layer 550 may include a same material, but may include different materials from each other. Various materials imparting insulating properties to the first insulating layer 510, the second insulating layer 520, the third insulating layer 530, and the passivation layer 550 may be applicable.

The first insulating layer 510 and the second insulating layer 520 may have different etching selection ratios, as described above. For example, when the first insulating layer 510 includes silicon oxide (SiOx), the second insulating layer 520 may include silicon nitride (SiNx). As another example, when the first insulating layer 510 includes silicon nitride (SiNx), the second insulating layer 520 may include silicon oxide (SiOx). However, the invention is not limited thereto.

The light emitting elements 300 may be manufactured on a substrate by an epitaxial growth method. The light emitting elements 300 may be manufactured by forming a seed crystal layer for forming a semiconductor layer on a substrate and depositing a desired semiconductor material on the seed crystal layer to grow the seed crystal layer. Hereinafter, a structure of the light emitting element 300 according to various embodiments will be described in detail with reference to FIG. 3.

Figure 3:
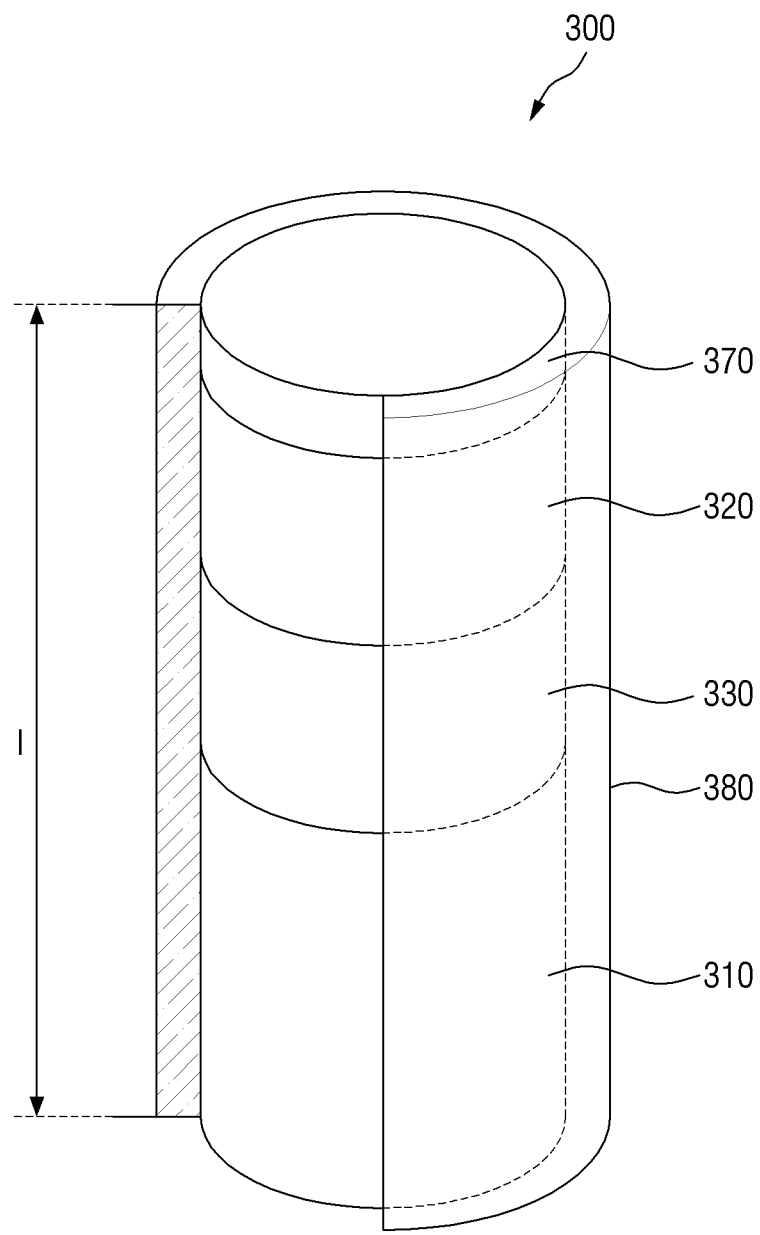
FIG. 3 is a schematic perspective view of a light emitting element according to an embodiment.

FIG. 3 is a schematic perspective view of a light emitting element according to an embodiment.

Referring to FIG. 3, the light emitting element 300 may include conductive semiconductor layers 310 and 320, an element active layer 330, an electrode material layer 370, and an insulating material layer 380. The electrical signal applied from the first electrode 210 and the second electrode 220 may be transmitted to the element active layer 330 through the conductive semiconductor layers 310 and 320 to emit light.

For example, the light emitting element 300 may include a first conductive semiconductor layer 310, a second conductive semiconductor layer 320, an element active layer 330 disposed between the first conductive semiconductor layer 310 and the second conductive semiconductor layer 320, an electrode material layer 370 disposed on the second conductive semiconductor layer 320, and an insulating material layer 380 surrounding an outer peripheral surface thereof. The insulating material layer 380 may be formed to contact the first conductive semiconductor 310, the second conductive semiconductor 320, the element active layer 330, and the electrode material layer 370 and surround an outer peripheral surface thereof. Although it is shown in FIG. 3 that the light emitting element 300 has a structure in which the first conductive semiconductor layer 310, the element active layer 330, the second conductive semiconductor layer 320, and the electrode material layer 370 are sequentially laminated in a length direction, the invention is not limited thereto. The electrode material layer 370 may be omitted, and in some embodiments, the electrode material layer 370 may also be disposed on at least one of both side surfaces of the first conductive semiconductor layer 310 and the second conductive semiconductor layer 320. Hereinafter, the light emitting element 300 of FIG. 3 will be described as an example, and a description of the light emitting element 300 to be described later may be equally applied even if the light emitting element 300 further includes other structures.

The first conductive semiconductor layer 310 may be an n-type semiconductor layer. For example, when the light emitting element 300 emits light of a blue wavelength band, the first conductive semiconductor layer 310 may be a semiconductor material having Formula of $In_xAl_yGa_{(1-x-y)}N$ ($0 \leq x \leq 1$, $0 \leq y \leq 1$, $0 \leq x+y \leq 1$). For example, the semiconductor material may be at least one of InAlGaN, GaN, AlGaN, InGaN, AlN, and InN, which are doped with an n-type semiconductor. The first conductive semiconductor layer 310 may be doped with a first conductive dopant, and, for example, the first conductive dopant may be Si, Ge, Sn, or the like. A length of the first conductive semiconductor layer 310 may be in a range of 1.5 μm to 5 μm, but is not limited thereto.

The second conductive semiconductor layer 320 may be a p-type semiconductor layer. For example, when the light emitting element 300 emits light of a blue wavelength band, the second conductive semiconductor layer 320 may be a semiconductor material having Formula of $In_xAl_yGa_{(1-x-y)}N$ ($0 \leq x \leq 1$, $0 \leq y \leq 1$, $0 \leq x+y \leq 1$). For example, the semiconductor material may be at least one of InAlGaN, GaN, AlGaN, InGaN, AlN, and InN, which are doped with a p-type semiconductor. The second conductive semiconductor layer 320 may be doped with a second conductive dopant, and, for example, the second conductive dopant may be Mg, Zn, Ca, Se, Ba, or the like. A length of the second conductive semiconductor layer 320 may be in a range of 0.08 μm to 0.25 μm, but is not limited thereto.

The element active layer 330 may be disposed between the first conductive semiconductor layer 310 and the second conductive semiconductor layer 320, and may include a material having a single or multiple quantum well structure. When the element active layer 330 includes a material having a multiple quantum well structure, the multiple quantum well structure may be a structure in which quantum layers and well layers are alternately laminated. The element active layer 330 may emit light by coupling of electron-hole pairs according to an electrical signal applied through the first conductive semiconductor layer 310 and the second conductive semiconductor layer 320. For example, when the element active layer 330 emits light of a blue wavelength band, it may include a material such as AlGaN or AlInGaN. For example, when the element active layer 330 has a multiple quantum well structure in which quantum layers and well layers are alternately laminated, the quantum layer may include a material such as AlGaN or AlInGaN, and the well layer may include a material such as GallorAlGaN.

However, the invention is not limited thereto. The element active layer 330 may have a structure in which semiconductor materials having high bandgap energy and semiconductor materials having low bandgap energy are alternately laminated, and may include other Group III-V semiconductor materials depending on the wavelength band of the emitted light. Accordingly, the light emitted from the element active layer 330 is not limited to light of a blue wavelength band, and in an embodiment, the element active material layer 330 may emit light of a red wavelength band or light of a green wavelength band. A length of the element active layer 330 may be in a range of 0.05 μm to 0.25 μm, but is not limited thereto.

The light emitted from the element active layer 330 may be emitted not only onto the outer surface of the light emitting element 300 in the length direction but also onto both side surfaces thereof. For example, the direction of the light emitted from the element active layer 330 is not limited to one direction.

The electrode material layer 370 may be an ohmic contact electrode. However, the invention is not limited thereto, and the electrode material layer 370 may be a Schottky contact electrode. The electrode material layer 370 may include a conductive metal. For example, the electrode material layer 370 may include at least one of aluminum (Al), titanium (Ti), indium (In), gold (Au), and silver (Ag), indium tin oxide (ITO), indium zinc oxide (IZO), and indium tin zinc oxide (ITZO). The electrode material layer 370 may include the same material, and may also include different materials. However, the invention is not limited thereto.

The insulating material layer 380 may be formed outside the first conductive semiconductor 310, the second conductive semiconductor 320, the element active layer 330, and the electrode material layer 370 to protect these members. For example, the insulating material layer 380 may be formed to surround the side surfaces of the members, and thus may not be formed at both ends of the light emitting element 300 in the length direction, for example, at both ends thereof at which the first conductive semiconductor layer 310 and the electrode material layer 370 are disposed. However, the invention is not limited thereto.

The insulating material layer 380 may include a material having insulating properties such as silicon oxide (SiOx), silicon nitride (SiNx), silicon oxynitride (SiOxNy), aluminum nitride (AlN), or aluminum oxide ($Al_2O_3$). Accordingly, the insulating material layer 380 may prevent an electrical short that may occur when the element active layer 330 is in direct contact with the first electrode 210 or the second electrode 220. Further, since the insulating material layer 380 may include the element active layer 330 to protect the outer peripheral surface of the light emitting element 300, the insulating material layer 380 may prevent a decrease in light emission efficiency.

Although it is shown in the drawing that the insulating material layer 380 may extend in the length direction to cover the first conductive semiconductor layer 310 to the electrode material layer 370, the invention is not limited thereto. The insulating material layer 380 may cover only the first conductive semiconductor layer 310, the element active layer 330, and the second conductive semiconductor layer 320, or may cover only a part of the outer surface of the electrode material layer 370 to expose a part of the outer surface of the electrode material layer 370.

A length of the insulating material layer 380 may be in a range of 0.5 μm to 1.5 μm, but is not limited thereto.

Further, in some embodiments, the outer peripheral surface of the insulating material layer 380 may be surface-treated. As described above, when the light emitting elements 300 are aligned between the electrodes 210 and 220, the light emitting elements 300 may be applied in a dispersed state in a solution. The insulating material layer 380 may be hydrophobically or hydrophilically surface-treated, so that the light emitting elements 300 may be maintained in a state in which the light emitting elements 300 are dispersed with each other in the solution. Accordingly, when aligning the light emitting elements 300, the light emitting elements 300 may be aligned between the first electrode 210 and the second electrode 220 without becoming aggregated.

The light emitting element 300 may have a cylindrical shape or a rod shape. Accordingly, the cross-sectional view of the light emitting element 300 taken in a length direction traversing both ends of the light emitting element 300 may have a rectangular shape. However, the shape of the light emitting element 300 is not limited thereto, and may have various shapes such as a cube, a rectangular parallelepiped, and a hexagonal column. A length of the light emitting element 300 may be in a range of 1 μm to 10 μm. For example, the length of the light emitting element 300 may be in a range of 2 μm to 5 μm. For example, the length of the light emitting element 300 may be about 4 μm. Further, a diameter of the light emitting element 300 may be in a range of 300 nm to 700 nm, and as described above, the light emitting elements 300 included in the display device 10 may have different diameters from each other depending on a difference in composition of the element active layer 330. For example, the diameter of the light emitting element 300 may be about 500 nm.

As described above, the light emitting elements 300 may be sprayed onto the electrodes 210 and 220 in a state of being dispersed in a solvent. For example, in order to manufacture the display device 10, the light emitting elements 300 may be prepared in a state of being dispersed in the light emitting element ink 1000. Since the light emitting elements 300 each including a semiconductor material have a large specific gravity, they may become aggregated and may easily precipitate out of light emitting element ink 1000. According to an embodiment, the light emitting element ink 1000 may include a light emitting element dispersant 700 to maintain the light emitting elements 300 in a dispersed state for a predetermined time.

Figure 4:
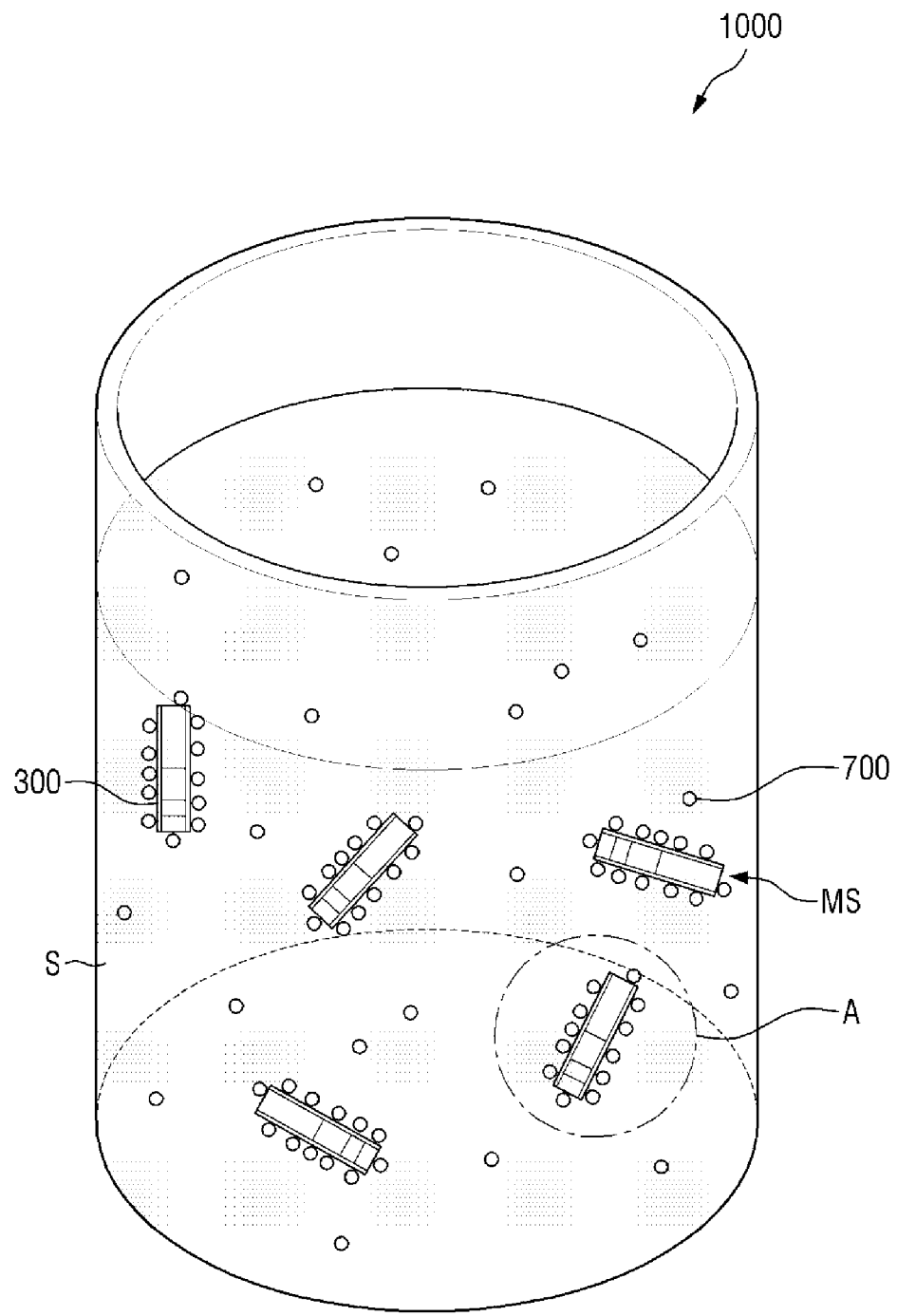
FIG. 4 is a schematic view illustrating a light emitting element ink in which light emitting elements are dispersed according to an embodiment.

FIG. 4 is a schematic view illustrating a light emitting element ink in which light emitting elements are dispersed according to an embodiment.

Referring to FIG. 4, a light emitting element ink 1000 according to an embodiment may include a solvent S, light emitting elements 300, and a light emitting element dispersant 700.

The solvent S of the light emitting element ink 1000 may be a material that can be commonly used to store the light emitting elements 300 in a dispersed state. The solvent S may be an organic solvent, and examples thereof may include, but are not limited to, propylene glycol monomethyl ether (PGME), propylene glycol monomethyl ether acetate (PGMEA), and propylene glycol (PG).

The light emitting elements 300 of the light emitting element ink 1000 may be dispersed in the solvent S. Since the structure or characteristics of the light emitting element 300 have been described as above, a detailed description thereof will be omitted. The light emitting element 300 may be a semiconductor crystal including a semiconductor layer doped with a first conductive (for example, n-type) material, a semiconductor layer doped with a second conductive (for example, n-type) material, and an active layer. When the solvent S includes the above-described types of materials, the light emitting elements 300 may have a greater specific gravity than the solvent S of the light emitting element ink 1000. Accordingly, the light emitting elements 300 may aggregate with each other in the solvent S, and may include semiconductor crystals having a large specific gravity to precipitate in the solvent S. During manufacturing the display device 10, when the light emitting element ink 1000 is sprayed onto the electrodes 210 and 220, the light emitting elements 300 may be unevenly sprayed, or the inlet of a nozzle may be blocked.

The light emitting element ink 1000 according to an embodiment may include a light emitting element dispersant 700 for dispersing the light emitting elements 300 in the solvent S. As shown in the drawing, the light emitting elements 300 may maintain a state of being dispersed in the solvent S of the light emitting element ink 1000 by the light emitting element dispersant 700.

The light emitting element dispersant 700 may have a structure capable of dispersing the light emitting elements 300 in the light emitting element ink 1000. The light emitting element dispersant 700 according to an embodiment may include a first functional group 710, a second functional group 720, and a photodegradable functional group 730.

The light emitting element dispersant 700 may include a first functional group 710 and a second functional group 720 having a different polarity from the first functional group 710. The first functional group 710 and the second functional group 720 may be functional groups that perform emulsification such that the light emitting element dispersant

700 can disperse the light emitting elements 300 in the solvent S. For example, one of the first functional group 710 and the second functional group 720 may be a hydrophilic functional group, and the other thereof may be a hydrophobic functional group. Accordingly, the light emitting element dispersant 700 may have amphiphilic properties, and may disperse the light emitting elements 300 in the solvent S.

As described above, the insulating material layer 380 having a relative polarity is formed on the outer surface of the light emitting element 300. The light emitting element ink 1000 according to an embodiment may include the light emitting element dispersant 700 to maintain a state in which the light emitting elements 300 are dispersed for a predetermined time. Therefore, as will be described later, during the process of manufacturing the display device 10, the light emitting element ink 1000 may be sprayed through a nozzle in a state in which the light emitting elements 300 are dispersed in the solvent S.

Figure 5:
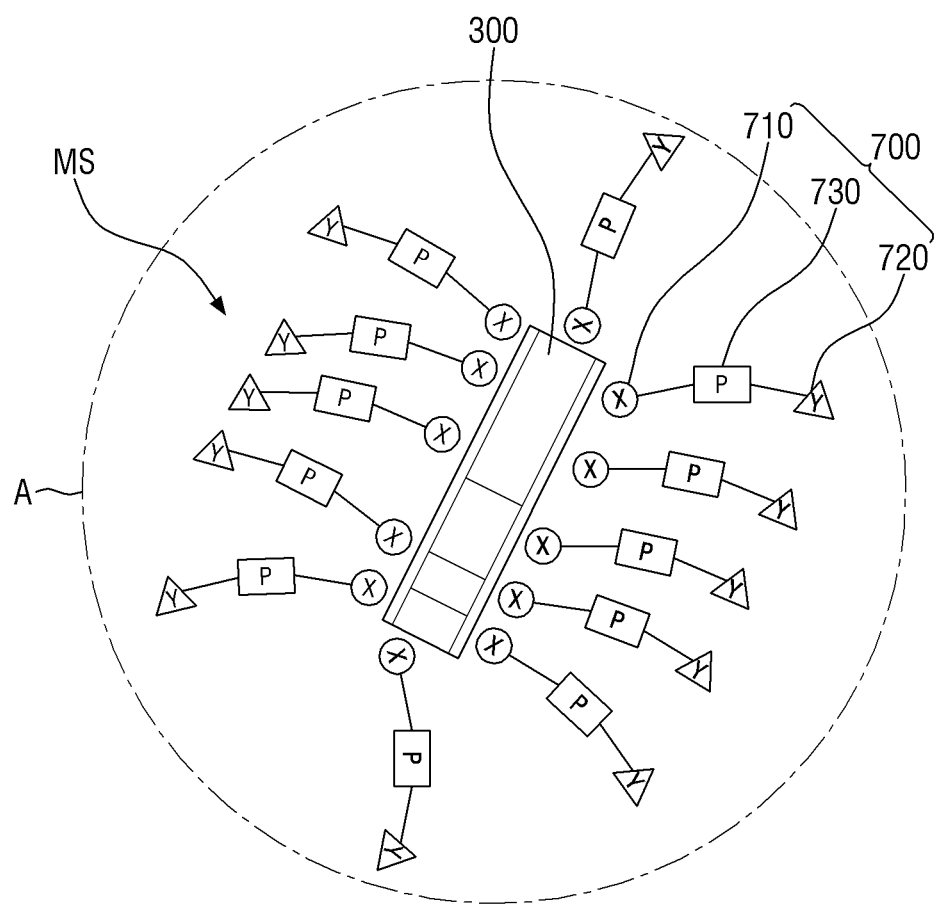
FIG. 5 is an enlarged view of portion A in FIG. 4.

FIG. 5 is an enlarged view of portion A in FIG. 4.

Referring to FIGS. 4 and 5, according to an embodiment, at least some of the light emitting element dispersants 700 may surround the outer surface of the light emitting element 300 in the solvent S to form a dispersion structure MS. The first functional group (710, X) of the light emitting element dispersant 700 may be oriented toward the center of the dispersion structure MS, and the second functional group (720, Y) may be oriented toward the outside of the dispersion structure MS.

As described above, the solvent S of the light emitting element ink 1000 and the insulating material layer 380 of the light emitting element 300 may have polarities opposite to each other. For example, the solvent S may be an organic solvent of the above-described type, and the insulating material layer 380 of the light emitting element 300 may include a material such as silicon oxide ($SiO_2$). The attractive force between the light emitting elements 300 acts stronger than the attractive force between the light emitting element 300 and the solvent S, so that the light emitting elements 300 may aggregate with each other.

In an embodiment, the first functional group 710 and the second functional group 720 of the light emitting element dispersant 700 may have different polarities from each other. In the light emitting element dispersant 700, at least one of the first functional group 710 and the second functional group 720 may form a strong attractive force with the light emitting element 300, and the other thereof may form a strong attractive force with the solvent S. Accordingly, the light emitting element dispersants 700 may surround the light emitting element 300 in the solvent S to form the dispersion structure MS. For example, the light emitting element dispersants 700 may form a micelle structure in the solvent S.

It is shown in the drawings that, in the dispersion structure MS, the first functional groups 710 of the light emitting element dispersants 700 are oriented toward the center of the dispersion structure MS, and the second functional groups 720 thereof are oriented toward the outside of the dispersion structure MS. For example, the first functional group 710 may be a hydrophilic functional group that forms a strong attractive force with the insulating material layer 380 of the light emitting element 300, and the second functional group 720 may be a hydrophobic functional group that forms a strong attractive force with the solvent S. However, the invention is not limited thereto, and the light emitting element dispersant 700 may include an opposite case.

Further, the light emitting element dispersant 700 may include a photodegradable functional group 730 to which at least one of the first functional group 710 and the second functional group 720 is bonded. As shown in the drawing, the light emitting element dispersant 700 may include a photodegradable functional group (730, P) to which each of the first functional group (710, X) and the second functional group (720, Y) is bonded. The bonding relationships between the photodegradable functional group 730 and the first functional group 710 and between the photodegradable functional group 730 and the second functional group 720 are not limited thereto. At least one of the first functional group 710 and the second functional group 720 may be bonded to the photodegradable functional group 730, and each of these functional groups 710 and 720 may not necessarily be bonded to the photodegradable functional group 730. A more detailed description thereof will be provided later.

In order to disperse the light emitting elements 300 each including a semiconductor crystal in the solvent S, the light emitting element dispersant 700 may include a functional group having a large molecular weight. For example, the light emitting element dispersant 700 may include a hydrophobic functional group of the first functional group 710 and the second functional group 720 as a polymer or may include other types of functional groups. The amphiphilicity of light emitting element dispersant 700 increases, and thus the light emitting elements 300 may maintain a dispersed state in the solvent S for a long time.

However, since the light emitting element dispersant 700 may act as foreign matter in a subsequent process, a process of removing the foreign matter is required. However, the light emitting element dispersant 700 having a large molecular weight may not be easily removed even at high temperatures. As will be described later, when the light emitting element dispersant 700 remains even after the light emitting element ink 1000 is sprayed onto each of the electrodes 210 and 220, a light emission defect of the display device 10 may occur.

The light emitting element dispersant 700 according to an embodiment may include a photodegradable functional group 730 in which a bond is decomposed by irradiated light, and may form a dispersant fragment 700' having a smaller molecular weight than the light emitting element dispersant 700 as light is irradiated.

The photodegradable functional group 730 may have a structure having a relatively weak bonding force. In order to form an energetically stable structure by absorbing energy of irradiated light, some bonds of the photodegradable functional group 730 may be decomposed. When the bonds of the photodegradable functional group 730 are decomposed, the light emitting element dispersant 700 may form a dispersant fragment 700' having a small molecular weight. The light emitting element dispersant 700 may form dispersant fragments 700' having the same structure depending on the structure of the photodegradable functional group 730 and the position of the bond to be decomposed. However, the invention is not limited thereto, and in an embodiment, dispersant fragments 700' having different structures may be formed depending on the structure of the light emitting element dispersant 700.

When the display device 10 is manufactured, a process of applying light may be performed after the light emitting element ink 1000 is sprayed onto each of the electrodes 210 and 220 and the light emitting elements 300 are aligned. When the light emitting element ink 1000 is irradiated with light, the photodegradable functional group 730 may be decomposed, so that the light emitting element dispersant 700 may form a dispersant fragment 700'. Accordingly, the temperature at which the solvent S and light emitting element dispersant 700 of the light emitting element ink 1000 or the dispersant fragment 700' volatilize may be lowered.

Figure 6:
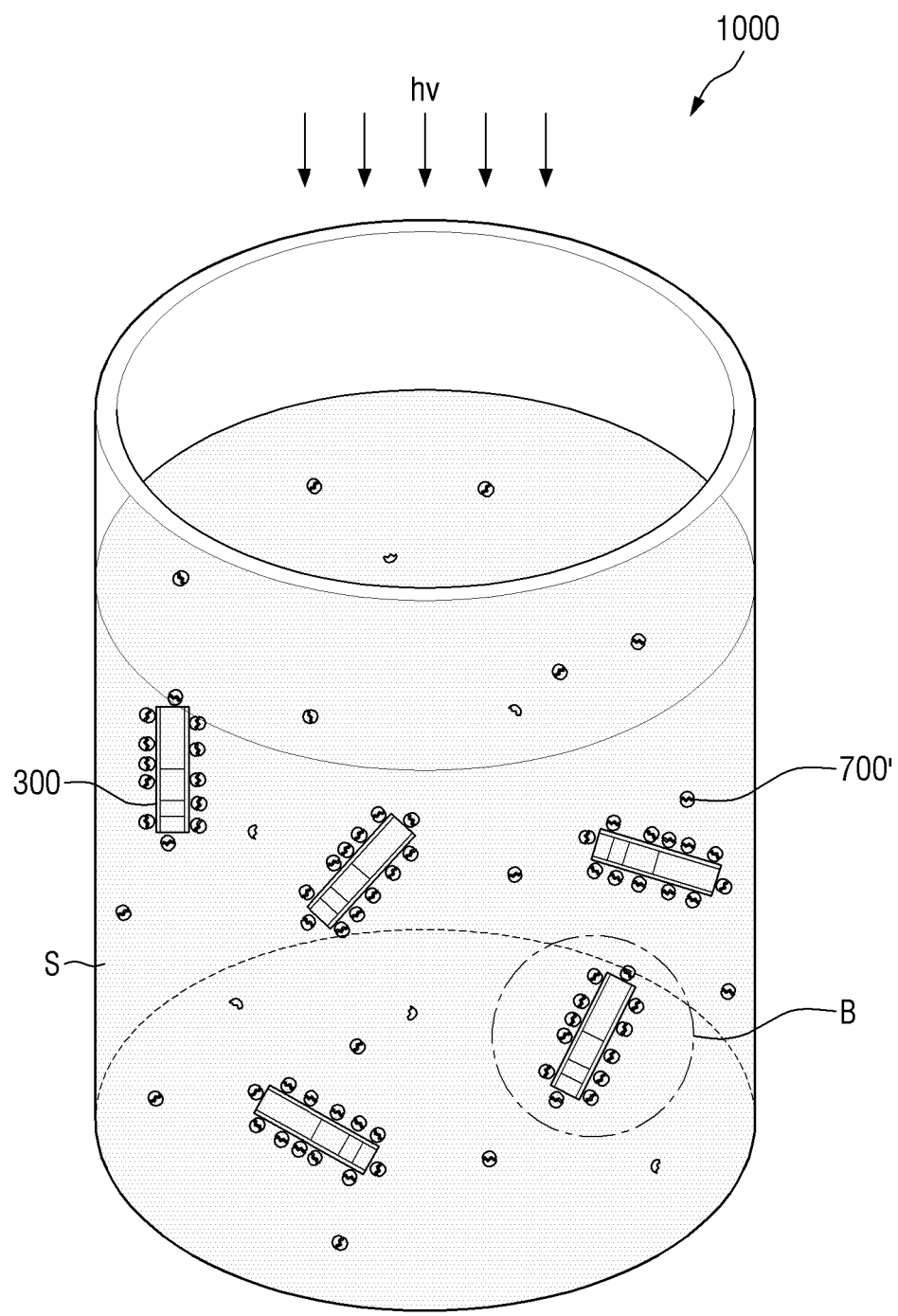
FIG. 6 is a schematic view illustrating a process of applying light to a light emitting element ink in which light emitting elements are dispersed according to an embodiment.
Figure 7:
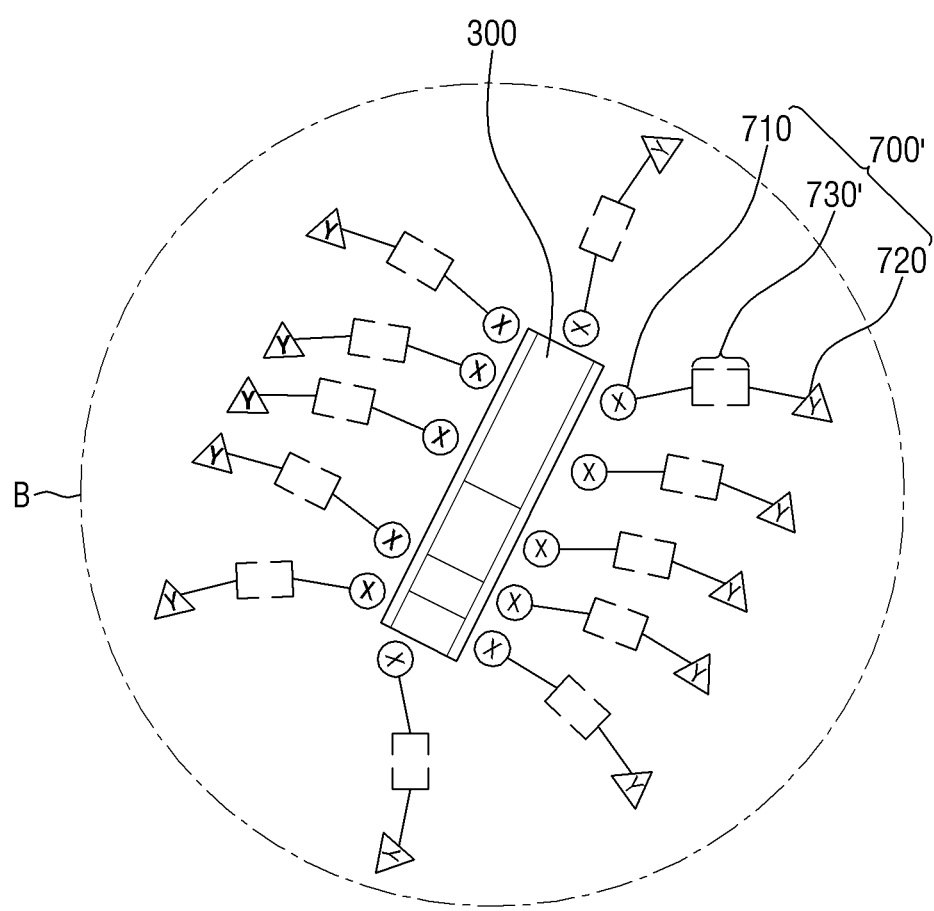
FIG. 7 is an enlarged view of portion B in FIG. 6.

FIG. 6 is a schematic view illustrating a process of applying light to a light emitting element ink in which light emitting elements are dispersed according to an embodiment. FIG. 7 is an enlarged view of portion B in FIG. 6.

Referring to FIGS. 6 and 7, when the light emitting element ink 1000 is irradiated with light hv, the bonding of the photodegradable functional group 730' may be decomposed, and a dispersant fragment 700' may be formed. It may be understood that the dispersant fragment 700' is a byproduct of the decomposition reaction of the light emitting element dispersant 700 by light. A part of the dispersant fragment 700' formed by the decomposition of the photodegradable functional group 730 may exist adjacent to the light emitting element 300, and the remaining part thereof may be dispersed in the solvent S of the light emitting element ink 1000.

In the light emitting element dispersant 700 shown in FIGS. 4 to 7, the first functional group 710 and the second functional group 720 are each bonded to the photodegradable functional group 730. Accordingly, the dispersant fragment 700' may include a molecule including the first functional group 710 and another molecule including the second functional group 720. However, as described above, the invention is not limited thereto, and the dispersant fragment 700' may include molecules having the same structure. The dispersant fragment 700' may include at least one of the first functional group 710 and the second functional group 720, and may include both functional groups in an embodiment.

The light emitting element dispersant 700 according to an embodiment may have any one of Structural Formulas 1 to 3 below.

X-P-Y       [Structural Formula 1]

P-Y-X       [Structural Formula 2]

P-X-Y       [Structural Formula 3]

In Structural Formulas 1 to 3, X is the first functional group 710, Y is the second functional group 720, and P is the photodegradable functional group 730.

Referring to Structural Formulas 1 to 3, the light emitting element dispersant 700 according to an embodiment may include a photodegradable functional group (730, P), and the photodegradable functional group (730, P) may be bonded to at least one of a first functional group (710, X) and a second functional group (720, Y). The photodegradable functional group (730, P) of the light emitting element dispersant 700 may be directly bonded with the first functional group (710, X) and the second functional group (720, Y) that emulsify and disperse the light emitting elements 300 in the solvent S of the light emitting element ink 1000. FIGS. 4 to 7 illustrate that the light emitting element dispersant 700 has a structure of Structural Formula 1 above. However, the invention is not limited thereto, and the light emitting element dispersant 700 may have structures of Structural Formulas 2 or 3 or other structures.

In Structural Formulas 1 to 3, each of the light emitting element dispersants 700 has a structure including the first functional group (710, X), the second functional group (720, Y), and the photodegradable functional group (730, P), but the invention is not limited thereto. In some embodiments, in the light emitting element dispersant 700, one or more first functional groups (710, X) and one or more second functional groups (720, Y) may be bonded to the photodegradable functional group (730, P), and the light emitting element dispersant 700 may further include functional groups other than these functional groups.

For example, the light emitting element dispersant 700 may have a structure in which each of the first functional group 710 and the second functional group 720 is bonded to the photodegradable functional group 730, and another second functional group 720 may be further bonded to the first functional group 710. The molecular weight of the light emitting element dispersant 700 and the amphiphilicity due to the first and second functional groups 710 and 720 may increase, so that the light emitting elements 300 are easily dispersed in the light emitting element ink 1000. Further, even when the light emitting element dispersant 700 includes a larger number of functional groups, the photodegradable functional group 730 may be decomposed to form a dispersant fragment 700' having a low volatilization temperature, so that the light emitting element ink 1000 and the light emitting element dispersant 700 may be easily removed in a subsequent process.

For example, the photodegradable functional group 730 may be any one of a cyclobutyl group, a maleic imide dimer group, an acrylate dimer group, and a carbonyl group. However, the invention is not limited thereto.

Among the above-described functional groups, as represented in Chemical Reaction Formulas 1 to 4 below, the photodegradable functional group 730 may be decomposed by irradiated light, and the light emitting element dispersant 700 may be separated into molecules having a small molecular weight.

[Chemical Reaction Formula 1]

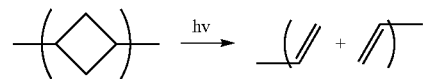

[Chemical Reaction Formula 2]

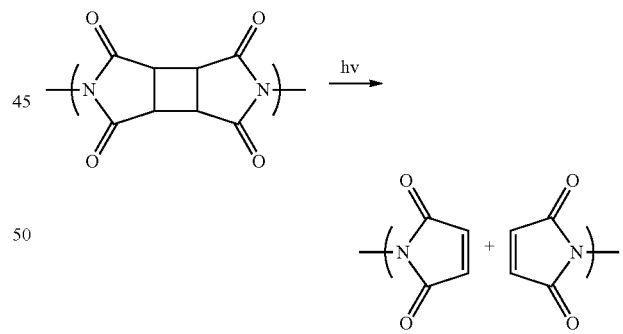

[Chemical Reaction Formula 3]

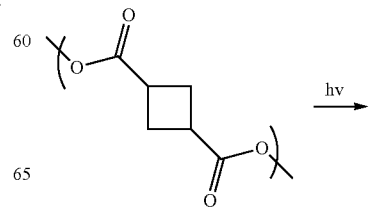

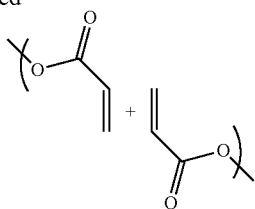

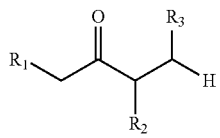

[Chemical Reaction Formula 4]

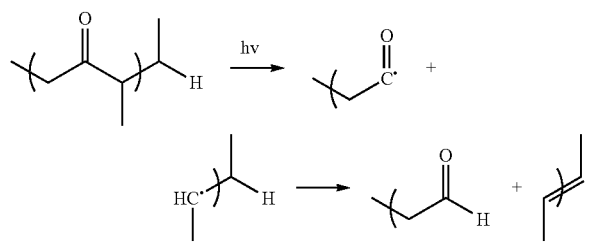

For example, as represented in Chemical Reaction Formula 1, when the photodegradable functional group 730 is a cyclobutyl group, the cyclobutyl group may be separated into two alkene molecules through a reverse cycloaddition (retro-[2+2]cycloaddition) reaction by light irradiation. Accordingly, the light emitting element dispersant 700 may be separated into two dispersant fragments 700' (for example, two alkene molecules) having a small molecular weight, and may be volatilized and removed even at a low temperature. Even in the case of Chemical Reaction Formulas 2 to 4, the above procedures may be understood in the same way, detailed descriptions thereof will be omitted.

In an embodiment, the light emitting element dispersant 700 may be any one of compounds represented by Chemical Structural Formulas 1 to 4 below.

[Chemical Structural Formula 1]

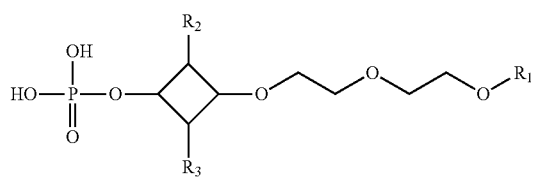

[Chemical Structural Formula 2]

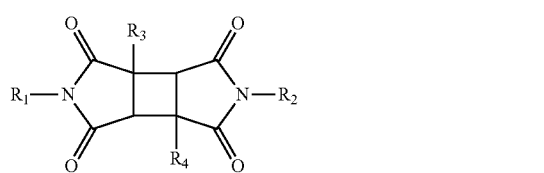

[Chemical Structural Formula 3]

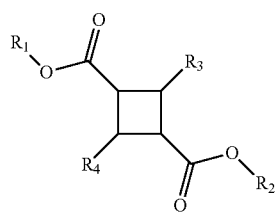

[Chemical Structural Formula 4]

In Chemical Structural Formulas 1 to 4, $R_1$, $R_2$, $R_3$, and $R_4$ may each independently be one of an alkyl group of $C_1$-$C_{10}$, an alkenyl group of $C_2$-$C_{10}$, an alkynyl group of $C_2$-$C_{10}$, an alkyl ether group of $C_1$-$C_{10}$, and an alkenyl ether group of $C_2$-$C_{10}$.

Referring to Chemical Structural Formulas 1 to 4, each of the light emitting element dispersants 700 includes a functional group having at least one bond which can be decomposed by light irradiation, and includes at least one hydrophilic functional group and at least one hydrophobic functional group. $R_1$ to $R_4$ may be functional groups appropriately selected such that the light emitting element dispersants 700 has a molecular weight sufficient to disperse the light emitting elements 300. $R_1$, $R_2$, $R_3$, and $R_4$ may each independently be one of an alkyl group of $C_1$-$C_{10}$, an alkenyl group of $C_2$-$C_{10}$, an alkynyl group of $C_2$-$C_{10}$, an alkyl ether group of $C_1$-$C_{10}$, and an alkenyl ether group of $C_2$-$C_{10}$. However, the invention is not limited thereto.

For example, the compound of Chemical Structural Formula 1 includes a cyclobutyl group as a functional group having at least one bond which can be decomposed by light irradiation, a phosphoric acid group ($—H_2PO_4$) as a hydrophilic functional group, and a diethylene glycol monomethyl ether ($—C_5H_{11}O_3$) group as a hydrophobic group. In the light emitting element dispersant 700 of Chemical Structural Formula 1, the cyclobutyl group may be separated into two alkene molecules through a reverse cycloaddition (retro-[2+2]cycloaddition) reaction by light irradiation. Each of the two alkene molecules formed in this way includes a phosphoric acid group ($—H_2PO_4$) and a diethylene glycol monomethyl ether ($—C_5H_{11}O_3$) group. In other words, any one of a phosphoric acid group ($—H_2PO_4$) and a diethylene glycol monomethyl ether ($—C_5H_{11}O_3$) group may be the first functional group 710, the other thereof may be the second functional group 720, and the dispersant fragment 700' formed by light irradiation may be an alkene molecule including a phosphoric acid group ($—H_2PO_4$) and a diethylene glycol monomethyl ether ($—C_5H_{11}O_3$) group. The dispersant fragment 700' is a compound having a smaller molecular weight smaller than the light emitting element dispersant 700, and may be volatilized and removed at a relatively low temperature.

The light emitting element dispersant 700 according to an embodiment may have a molecular weight in a range of 500 g/mol to 800 g/mol, and the dispersant fragment 700' may have a boiling point in a temperature range of 100° C. to 200° C. As the molecular weight of the light emitting element dispersant 700 increases, the light emitting elements 300 having a greater specific gravity may be dispersed in the solvent S of the light emitting element ink 1000 for a predetermined time. In some embodiments, the light emitting element ink 1000 may be sprayed through an inkjet process. In order to ensure the dispersion stability of the light emitting elements 300 and have the minimum viscosity possible for the inkjet process, the light emitting element dispersant 700 may have a molecular weight within the above range. When the molecular weight of the light emitting element dispersant 700 is equal to or less than 500 g/mol, after the light emitting element ink 1000 is manufactured, the dispersion state of the light emitting elements 300 may not be maintained, and the light emitting element ink 1000 may not be sprayed through a nozzle. Further, when the light emitting element dispersant 700 has a large molecular weight of equal to or greater than 800 g/mol, the dispersant fragment 700' formed by decomposing the photodegradable functional group 730 by light irradiation may also have a large molecular weight and may not be easily volatilized.

In contrast, since the light emitting element dispersant 700 according to an embodiment has a molecular weight within the above range and the dispersant fragment 700' formed by the decomposition of the photodegradable functional group 730 has a low molecular weight, the light emitting element dispersant 700 and the dispersant fragment 700' may be volatilized and removed at a relatively low temperature. As an example, the dispersant fragment 700' may have a boiling point in a temperature range of 100° C. to 200° C., and thus may be volatilized and removed at the above temperature.

Hereinafter, a method of manufacturing the display device 10 using the light emitting element ink 1000 including the light emitting elements 300 and the light emitting element dispersants 700 will be described.

Figure 8:
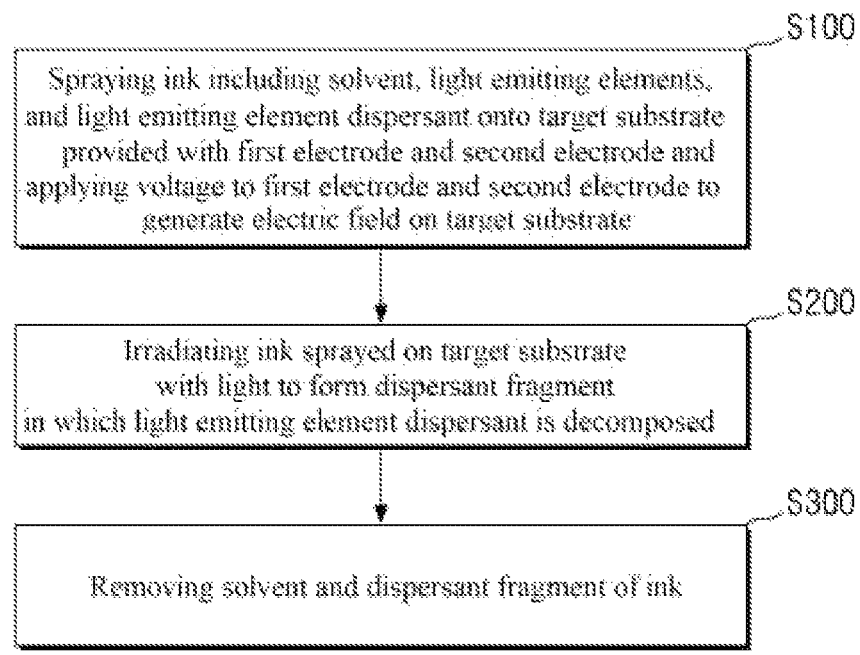
FIG. 8 is a flowchart illustrating a method of manufacturing a display device according to an embodiment.

FIG. 8 is a flowchart illustrating a method of manufacturing a display device according to an embodiment.

The method of manufacturing a display device 10 according to an embodiment includes the steps of: (S100) spraying a light emitting element ink 1000 including a solvent S, light emitting elements 300, and light emitting element dispersants 700 onto a target substrate SUB provided with a first electrode 210 and a second electrode 220, and applying a voltage to the first electrode 210 and the second electrode 220 to generate an electric field E on the target substrate SUB; (S200) irradiating the light emitting element ink 1000 sprayed on the target substrate SUB with light to form a dispersant fragment 700' in which the light emitting element dispersant 700 is decomposed; and (S300) removing the solvent S of the light emitting element ink 1000 and the dispersant fragment 700'.

The display device 10 may be manufactured by performing a process of aligning the light emitting elements 300 on each of the electrodes 210 and 220. As described above, the light emitting elements 300 may use a dielectrophoresis method in which the light emitting element ink 1000 is sprayed onto the target substrate SUB, and the electric field E is generated, and the light emitting elements are aligned. Since the light emitting element ink 1000 may become foreign matter in a subsequent process, a process of removing the light emitting element inks 1000 after aligning the light emitting elements 300 is performed. However, according to an embodiment, since the light emitting element ink 1000 includes the light emitting element dispersant 700 having a large molecular weight, the light emitting element ink 1000 is removed after the light emitting element dispersant 700 is decomposed into the dispersant fragment 700' having a small molecular weight. The method of manufacturing the display device 10 will be described in more detail with reference to FIGS. 9 to 20.

FIGS. 9 to 20 are plan views and cross-sectional views schematically illustrating a method of manufacturing a display device according to an embodiment.

Figure 9:
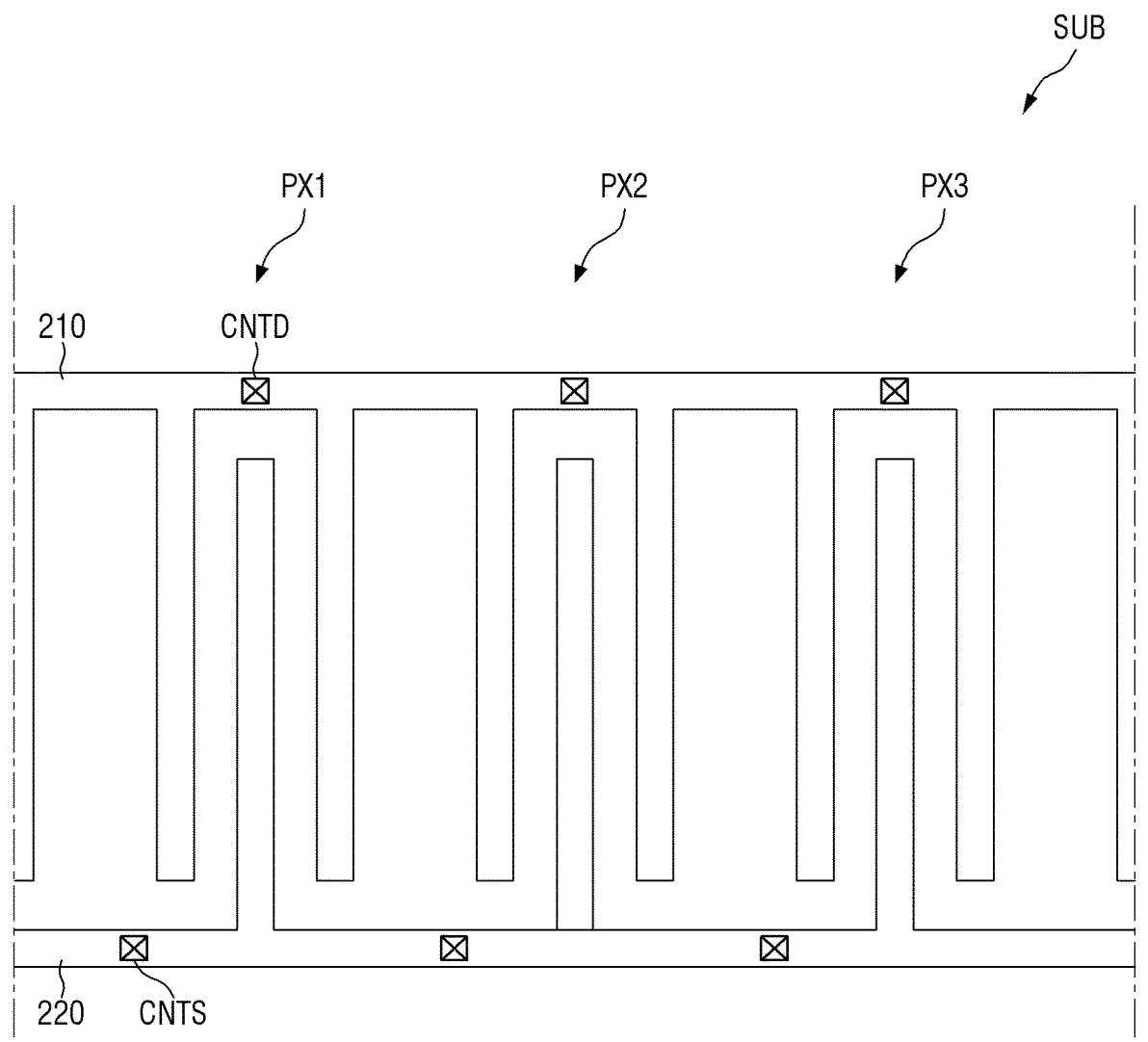
FIGS. 9 and 10 are each a plan view schematically illustrating steps of a method of manufacturing a display device according to an embodiment.
Figure 10:
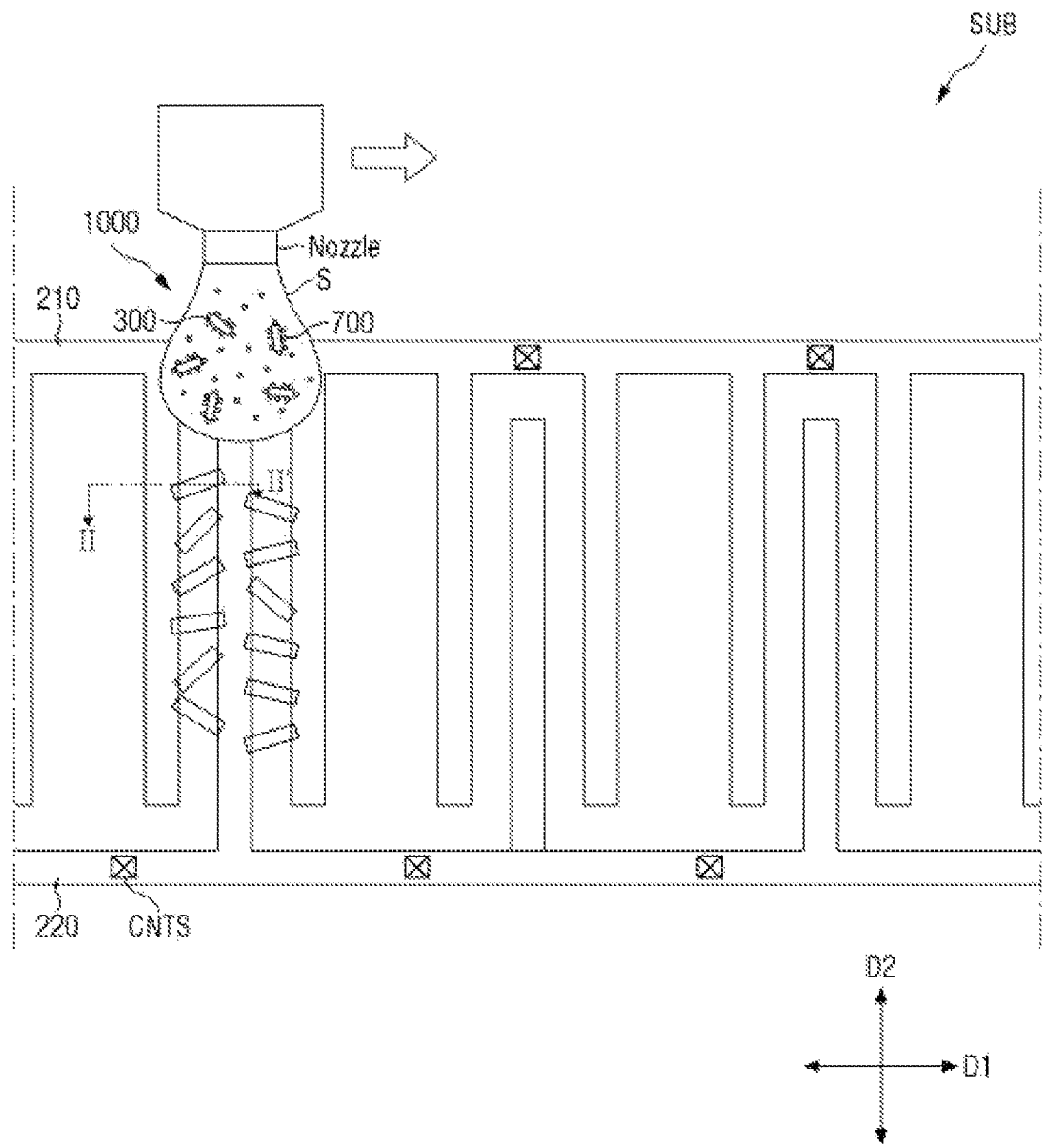

FIGS. 9 and 10 are each a plan view schematically illustrating steps of a method of manufacturing a display device according to an embodiment.

Figure 11:
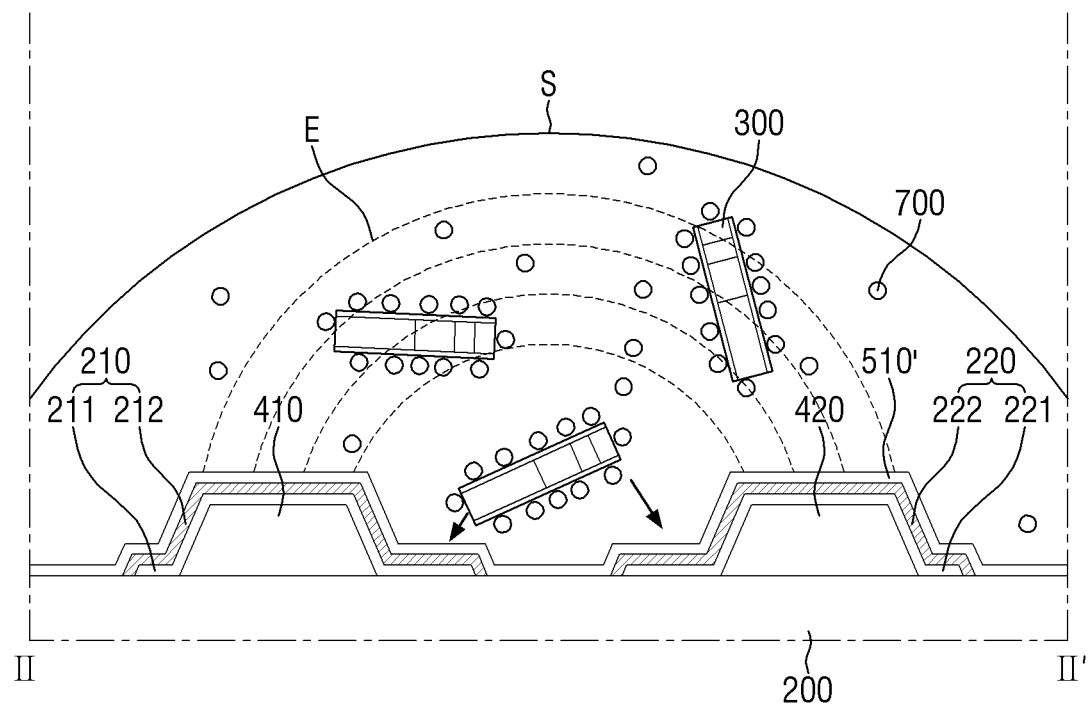
FIG. 11 is a schematic cross-sectional view taken along line II-IF of FIG. 10.

FIG. 11 is a schematic cross-sectional view taken along line II-IF of FIG. 10.

Figure 12:
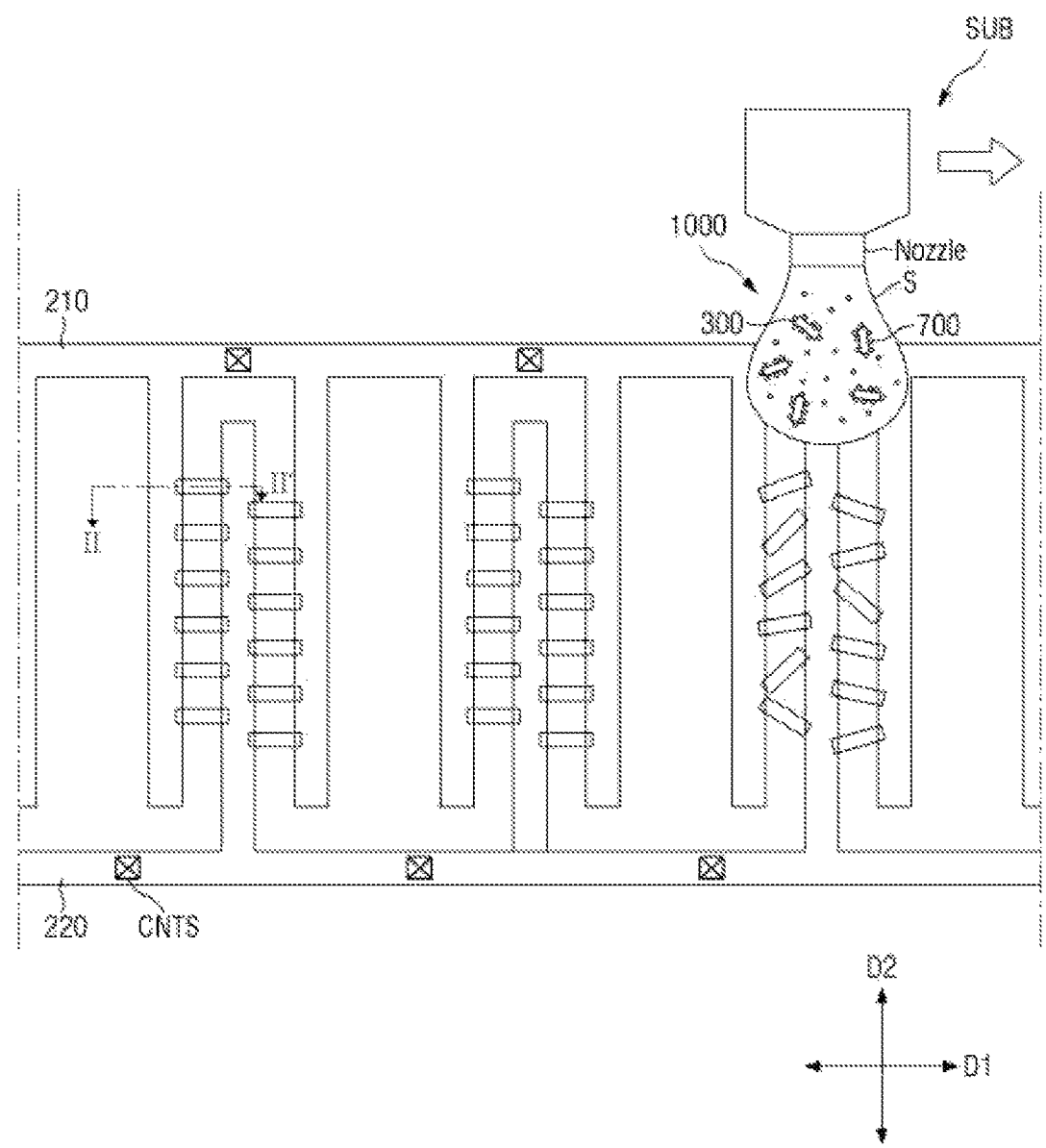
FIG. 12 is a plan view schematically illustrating steps of a method of manufacturing a display device according to an embodiment.

FIG. 12 is a plan view schematically illustrating steps of a method of manufacturing a display device according to an embodiment.

Figure 13:
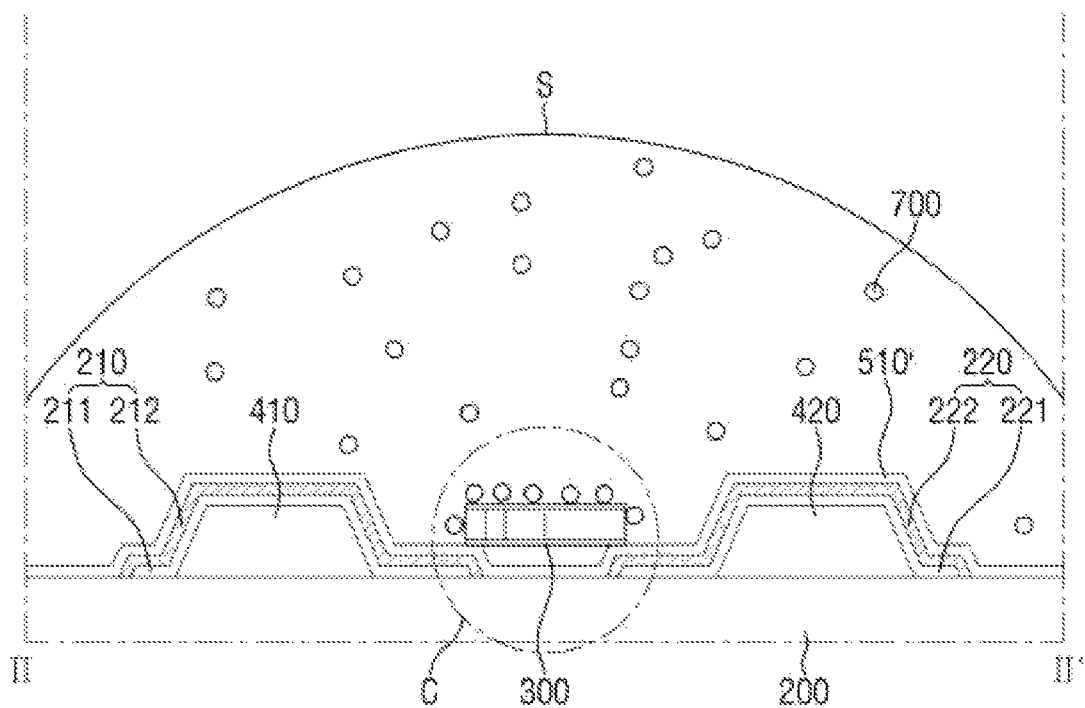
FIG. 13 is a schematic cross-sectional view taken along line II-IF of FIG. 12.

FIG. 13 is a schematic cross-sectional view taken along line II-IF of FIG. 12.

Figure 14:
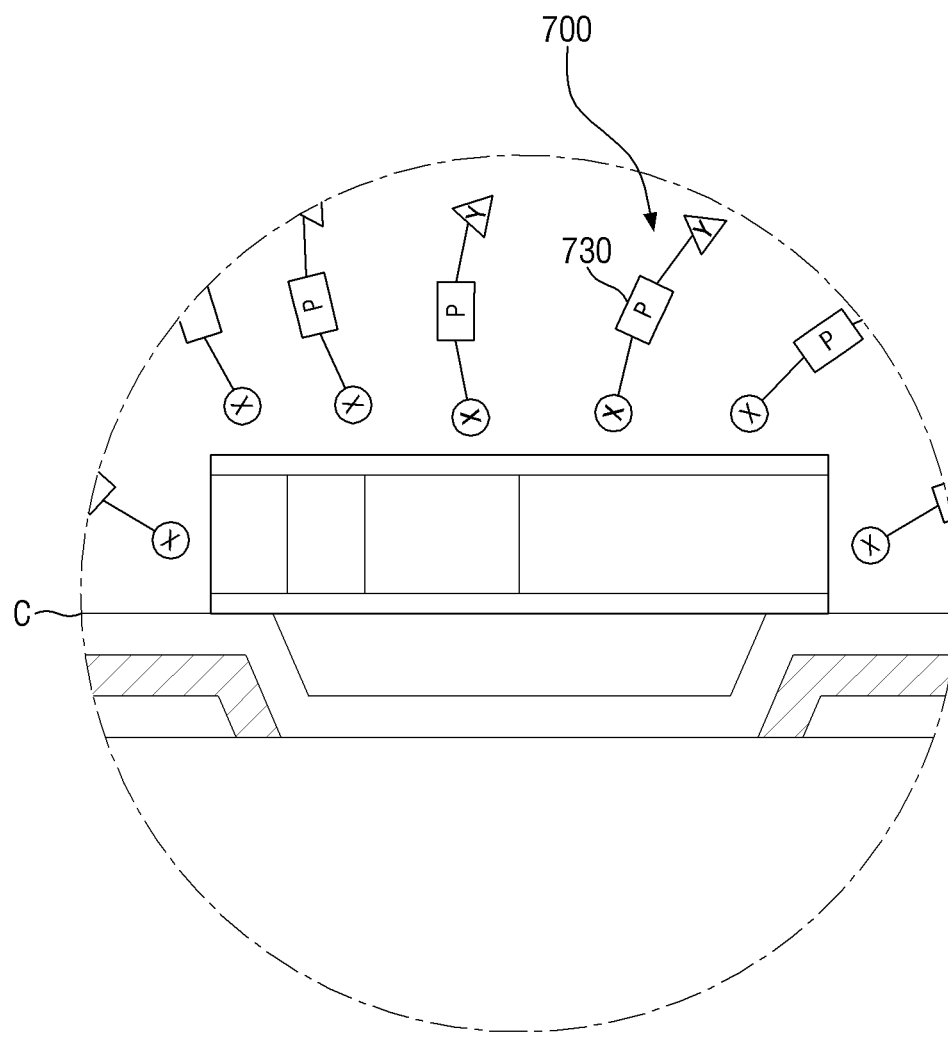
FIG. 14 is an enlarged view of portion C in FIG. 13.

FIG. 14 is an enlarged view of portion C in FIG. 13.

Figure 15:
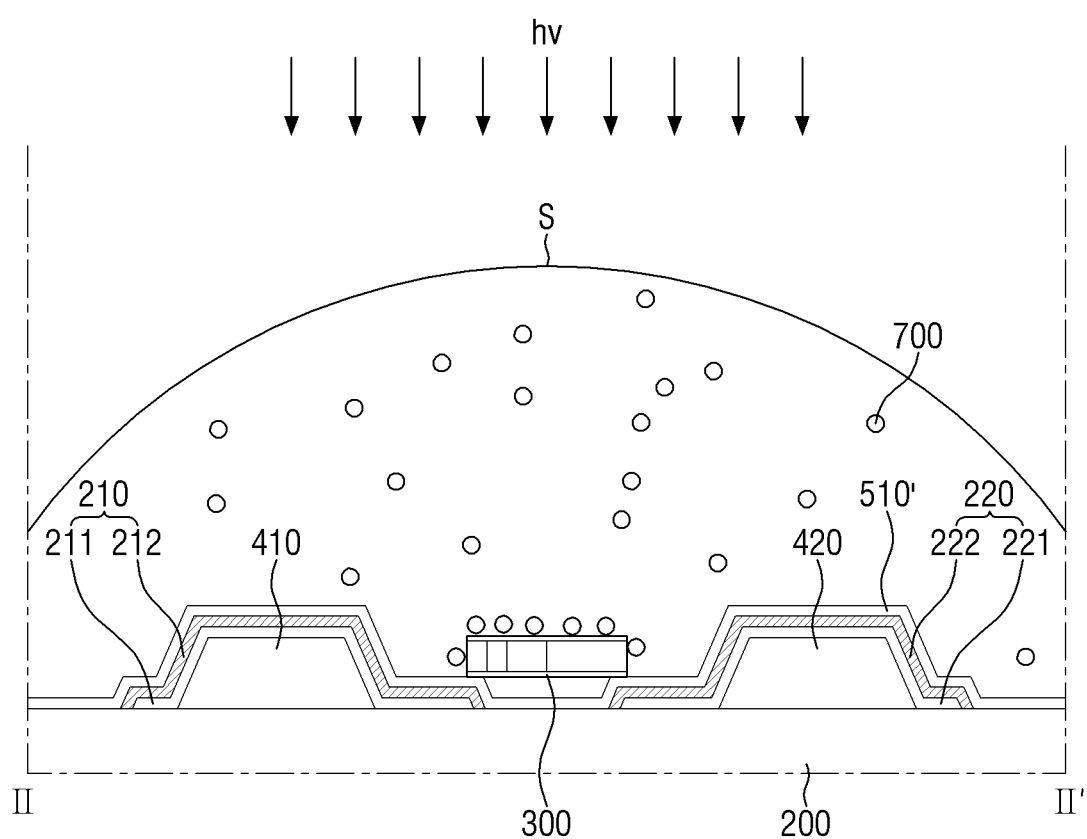
FIGS. 15 and 16 are each a schematic cross-sectional view taken along line II-IF illustrating steps of a method of manufacturing a display device according to an embodiment.
Figure 16:
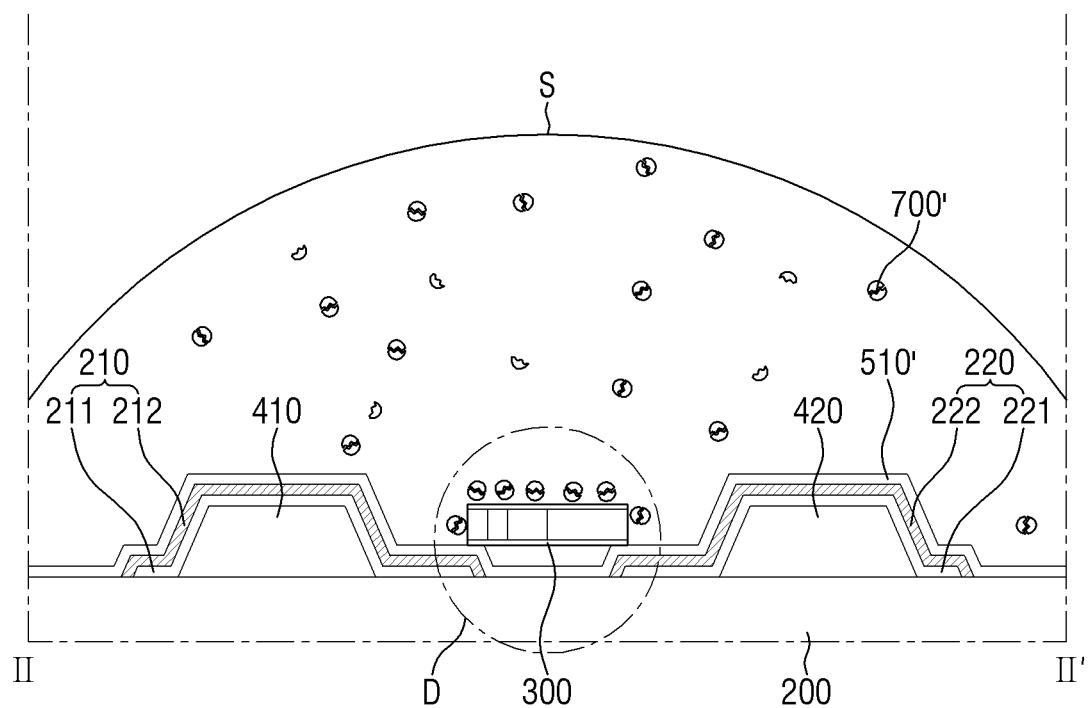

FIGS. 15 and 16 are each a schematic cross-sectional view taken along line II-IF illustrating steps of a method of manufacturing a display device according to an embodiment.

Figure 17:
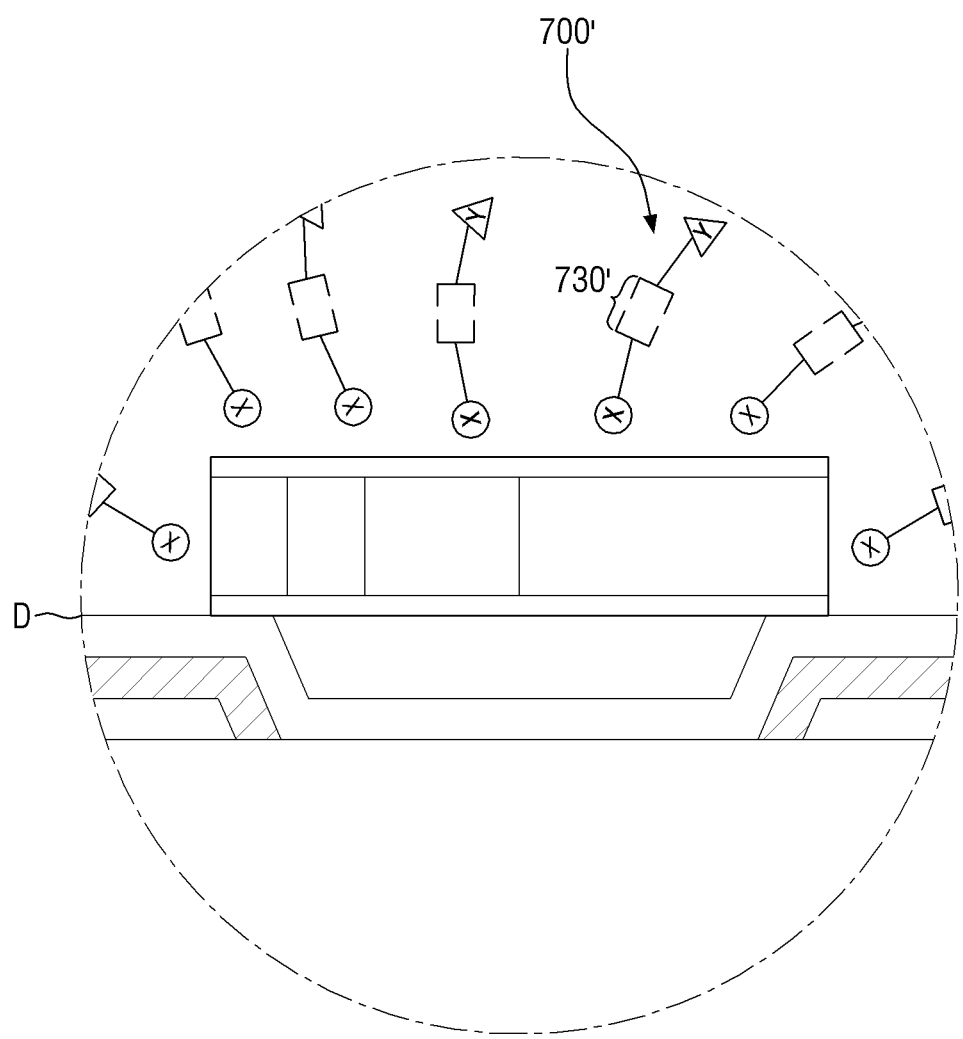
FIG. 17 is an enlarged view of portion D in FIG. 16.

FIG. 17 is an enlarged view of portion D in FIG. 16.

Figure 18:
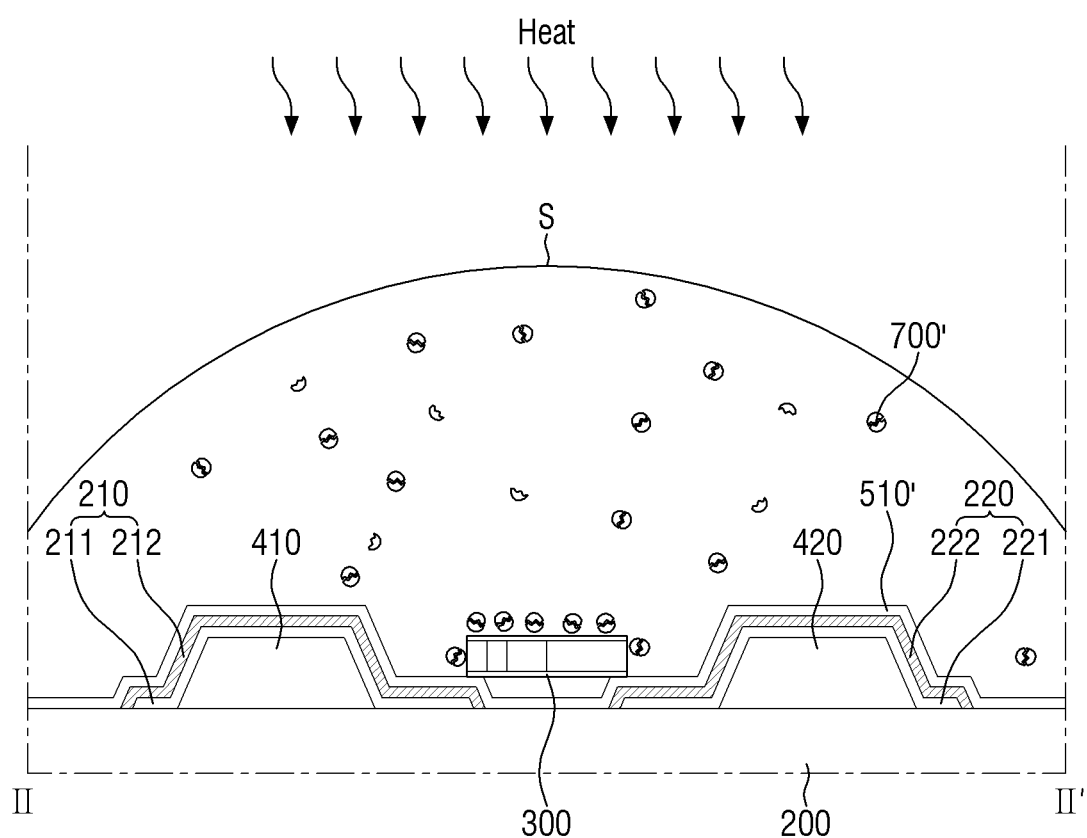
FIGS. 18 and 19 are each a schematic cross-sectional view taken along line II-IF illustrating steps of a method of manufacturing a display device according to an embodiment.
Figure 19:
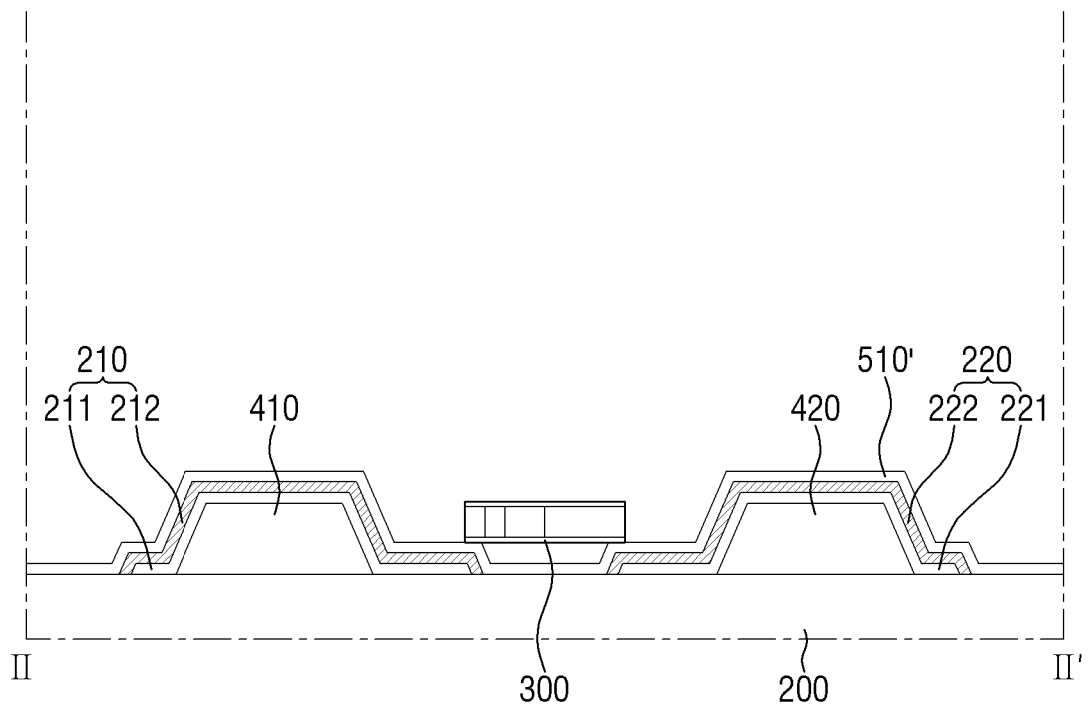

FIGS. 18 and 19 are each a schematic cross-sectional view taken along line II-IF illustrating steps of a method of manufacturing a display device according to an embodiment.

Figure 20:
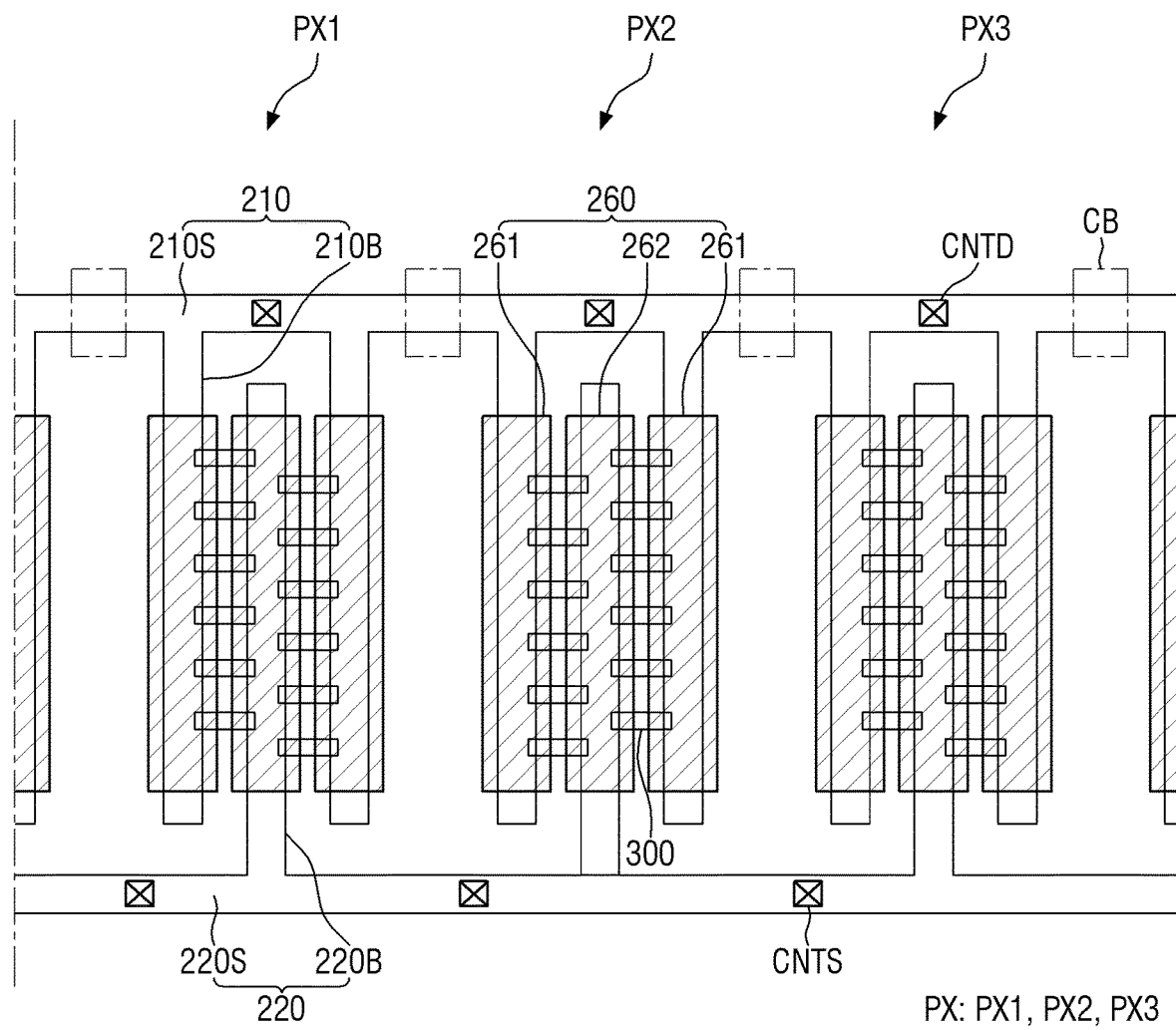
FIG. 20 is a plan view schematically illustrating steps of a method of manufacturing a display device according to an embodiment.

FIG. 20 is a plan view schematically illustrating steps of a method of manufacturing a display device according to an embodiment.

First, referring to FIG. 9, a target substrate SUB provided with a first electrode 210 and a second electrode 220 is prepared. Banks 410 and 420, a first electrode 210, a second electrode 220, and a first insulating material layer 510' (shown in FIG. 11) are arranged on the target substrate SUB. The first insulating material layer 510' is disposed to cover both upper surfaces of the first electrode 210 and the second electrode 220. The first insulating material layer 510' is partially patterned in a subsequent process to form the structure of the first insulating layer 510 of FIG. 2. The structure in which the first electrode 210 and the second electrode 220 are formed on the target substrate SUB is the same as that described above with reference to FIGS. 1 and 2. Hereinafter, overlapping descriptions will be omitted.

Although the target substrate SUB is not shown in the drawing, it may be understood that the target substrate SUB is the via layer 200 shown in FIG. 2. Further, in an area not shown in the drawing of the target substrate SUB, predetermined signal application pads capable of applying an alignment signal to the first electrode 210 and the second electrode 220 may be arranged. The alignment signal applied from the signal application pads may generate an electric field E on the target substrate SUB. However, the invention is not limited thereto.

Unlike FIG. 1, the first electrode 210 shown in FIG. 9 may be formed in a state in which the first electrode stem portions 210S extend to the adjacent pixel PX and are connected to each other. The first electrode stem portion 210S of FIG. 1 may be formed by performing a process of partially patterning the first electrode stem portion 210S after aligning the light emitting elements 300 between the first electrode 210 and the second electrode 220 in a step to be described later.

Referring to FIGS. 10 to 14, a light emitting element ink 1000 including a solvent S, light emitting elements 300, and light emitting element dispersants 700 are sprayed onto the target substrate SUB, and an electric field E is generated on the target substrate SUB (S100). The light emitting elements 300 dispersed in the light emitting element ink 1000 may be aligned between the first electrode 210 and the second electrode 220 by the electric field E generated on the target substrate SUB.

The light emitting element ink 1000 including the light emitting elements 300 and the light emitting element dispersants 700 may be sprayed onto the target substrate SUB through a nozzle. Although it is shown in the drawing that the light emitting elements are sprayed onto the target substrate SUB, the solvent S and light emitting element dispersants 700 of the light emitting element ink 1000 may also be sprayed simultaneously (shown in FIG. 11). The process of spraying the light emitting element ink 1000 may be performed by inkjet printing, die-slot coating, slit coating, or the like. In an embodiment, the light emitting element ink 1000 may be sprayed by an inkjet printing method using an inkjet printing machine.

The light emitting element ink 1000 including the light emitting elements 300 may be sprayed onto the first electrode 210 and the second electrode 220 formed on the target substrate SUB. The order of spraying the light emitting element ink 1000 is not particularly limited, but for example, the light emitting element ink 1000 may be sequentially sprayed from one side of the first pixel PX1 toward the other side of the third pixel PX3 in the first direction D1.

Although it is shown in the drawing that the nozzle moves only in the second direction D2, the invention is not limited thereto. In an embodiment, the nozzle may also move in the second direction D2 or in a direction other than the second direction D2 on the target substrate SUB, and may spray the light emitting element ink 1000. For example, when the amount of the light emitting element ink 1000 sprayed from the nozzle at one time does not sufficiently cover the electrodes 210 and 220 of each pixel PX, the nozzle may move in another direction. For example, the nozzle moves in the first direction D1 on the target substrate SUB, moves in the second direction D2, and moves in the first direction D1 again. These moving actions may be repeated. For example, the moving direction of the nozzle is not particularly limited as long as a sufficient amount of the light emitting element ink 1000 may be sprayed on the target substrate SUB.

The electric field E is not generated on the target substrate SUB before the light emitting element ink 1000 is sprayed, and is formed on the target substrate SUB after the light emitting element ink 1000 is sprayed on the first electrode 210 and the second electrode 220. For example, the electric field E may be generated on the target substrate SUB or between the first electrode 210 and the second electrode 220 by the alignment signal applied to the first electrode 210 and the second electrode 220.

In an embodiment, in the step of generating the electric field E, the light emitting elements 300 may be aligned between the first electrode 210 and the second electrode 220 by the electric field E generated on the target substrate SUB. The light emitting elements 300 included in the light emitting element ink 1000 may be aligned between the first electrode 210 and the second electrode 220 by receiving a dielectrophoretic force by the electric field E.

FIG. 11 schematically illustrates a process in which the light emitting elements 300 are aligned between the first electrode 210 and the second electrode 220 by the electric field E generated on the target substrate SUB. Referring to FIG. 11, an electric charge may be partially generated in the light emitting element 300 by an electric field E. For example, in the light emitting element 300, a negative electric charge may be generated in the first conductive semiconductor 310 doped with an n-type impurity by the electric field E, and a positive electric charge is generated in the second conductive semiconductor 320 doped with a p-type impurity by the electric field E. Accordingly, the light emitting element 300 may have a dipole formed by partial charge distribution. The light emitting elements 300 each having a dipole may receive a dielectrophoretic force (FDEP) by the electric field E, and may be aligned between the first electrode 210 and the second electrode 220.

Referring to FIGS. 12 to 14, the nozzle may move from one side of the first pixel PX1 to the other side of the third pixel PX3, and may spray the light emitting element ink 1000, and the light emitting elements 300 may be sequentially arranged on the first electrode 210 and the second electrode 220 of each pixel PX.

As described above, the light emitting elements 300 may exist in a state of being dispersed in the light emitting element ink 1000 by the light emitting element dispersant 700. As shown in FIG. 14, the light emitting element dispersants 700 containing the photodegradable functional group 730 may be formed to surround the outer surface of the light emitting element 300.

It is shown in the drawings that, for each pixel PX, the timing at which the light emitting element ink 1000 is sprayed is the same as the timing at which the electric field E is generated by applying an alignment signal. However, the invention is not limited thereto, and the timing at which the light emitting element ink 1000 is sprayed may be different from the timing at which the light emitting elements 300 are aligned by the generation of the electric field E. For example, the electric field E may be generated after the nozzle moves and sprays the light emitting element ink 1000 on all the areas of the first to third pixels PX1 to PX3. The light emitting elements 300 may be simultaneously aligned in the first pixel PX1 to the third pixel PX3.

The light emitting element ink 1000 sprayed on the target substrate SUB is irradiated with light to form a dispersant fragment 700' in which the light emitting element dispersants 700 is decomposed (S200).

As shown in FIG. 13, the light emitting element dispersant 700 may exist between the first electrode 210 and the second electrode 220 in the light emitting element ink 1000. The light emitting element dispersant 700 may become impurity in a subsequent process performed after aligning the light emitting elements 300. When manufacturing the display device 10, after aligning the light emitting elements 300, a process of removing the light emitting element ink 1000 and the light emitting element dispersant 700 is performed, and in an embodiment, the light emitting element dispersant 700 included in the light emitting element ink 1000 may include a molecule having a large molecular weight. Accordingly, in order to remove the light emitting element dispersant 700, a process of irradiating the light emitting element ink 1000 sprayed on the target substrate SUB with light hv is performed.

Referring to FIGS. 15 to 17, the light emitting element ink 1000 may be irradiated with light hv to form a dispersant fragment 700' in which the light emitting element dispersant 700 is decomposed. According to an embodiment, when the light emitting element ink 1000 is irradiated with light hv, the photodegradable functional group 730 of the light emitting element dispersant 700 may be at least partially decomposed by light hv to form a dispersant fragment 700'.

As described above, the photodegradable functional group 730 of the light emitting element dispersant 700 may have an unstable structure having a weak bonding force. The unstable structure of the photodegradable functional group 730 may absorb energy by incident light (hv), and may be converted into a stable structure by a reaction in which some bonds are decomposed. As shown in FIG. 16, some bonds of the light emitting element dispersant 700 may be decomposed to form a dispersant fragment 700' in the light emitting element ink 1000.

As the bond of the photodegradable functional group 730 is decomposed, the first functional group 710 or the second functional group 720 is separated into dispersant fragments 700' of different molecules, and the light emitting element dispersant 700 may form a dispersant fragment 700' having a small molecular weight. However, the invention is not limited thereto, and the first functional group 710 and the second functional group 720 may be included in the dispersant fragment 700' of the same molecule. It is not particularly limited as long as the light emitting element dispersant 700 can form a dispersant fragment 700' having a small molecular weight as the bond of the photodegradable functional group 730 is decomposed.

As described above, in the process of manufacturing the display device 10, when the light emitting element ink 1000 including the light emitting element dispersant 700 having a high molecular weight is directly removed, it is necessary to perform the removal process under a high temperature environment for a long time. Further, molecules having a large molecular weight are not easy to completely remove on each of the electrodes 210 and 220, and may remain as foreign matter in a subsequent process.

In contrast, the method of manufacturing the display device 10 according to an embodiment includes a process of forming a dispersant fragment 700' by decomposing some bonds of the element dispersant 700 in addition to the process of applying light hv. Accordingly, the dispersant fragment 700' having a small molecular weight may be easily removed in a subsequent process.

Referring to FIGS. 18 and 19, a process of removing the solvent S and the dispersant fragment 700' is performed (S300). According to an embodiment, the step of removing the light emitting element ink 1000 and the dispersant fragment 700' may include a step of heat-treating the light emitting element ink 1000 sprayed on the target substrate SUB to volatilize the solvent S and the dispersant fragment 700'.

The dispersant fragment 700' formed by performing the process of applying light hv onto the target substrate SUB has a small molecular weight. Since the dispersant fragment 700' may be volatilized at a lower temperature as compared with the light emitting element dispersant 700, the light emitting element ink 1000 and the dispersant fragment 700' may be removed by performing a heat treatment process.

In an embodiment, the process of heat treating the light emitting element ink 1000 may be performed in a temperature range of 100° C. to 200° C. However, the invention is not limited thereto, and the temperature may vary depending on the molecular weight and heat treatment time of the dispersant fragment 700'. The temperature is a temperature sufficient to remove the dispersant fragment 700', but is not particularly limited as long as it is a temperature to such a degree that the members of the target substrate SUB are not damaged. Accordingly, as shown in FIG. 19, the light emitting elements 300 may be aligned on the first electrode 210 and the second electrode 220, and the light emitting element ink 1000 and the dispersant fragment 700' in which the light emitting element dispersant 700 is decomposed may be removed.

Finally, referring to FIG. 20, a contact electrode 260 and insulating layers are formed on the light emitting element 300, and the first electrode stem portion 210S is partially patterned along the cutting line CB. Accordingly, the display device 10 of FIG. 1 may be manufactured.

As described above, the light emitting element dispersant 700 according to an embodiment includes a photodegradable functional group 730 having at least one bond that is decomposed when light hv is applied, and the light emitting element dispersant 700 may form a dispersant fragment 700' having a small molecular weight. Accordingly, when the display device 10 is manufactured, the element ink 1000 capable of forming foreign matter between the electrodes 210 and 220 may be removed by heat treatment at a relatively low temperature.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

The invention claimed is:

1. A method of manufacturing a display device, the method comprising:
spraying an ink including a solvent, light emitting elements, and a light emitting element dispersant onto a target substrate provided with a first electrode and a second electrode;
applying a voltage to the first electrode and the second electrode to generate an electric field on the target substrate;
irradiating the ink sprayed on the target substrate with light to form a dispersant fragment in which the light emitting element dispersant is decomposed; and
removing the solvent and the dispersant fragment of the ink.

2. The method of claim 1, wherein the light emitting element dispersant includes:
at least one first functional group;
at least one second functional group having a different polarity from the first functional group; and
a photodegradable functional group to which at least one of the first functional group and the second functional group is bonded.

3. The method of claim 2, wherein, in the forming of the dispersant fragment, at least one bond of the photodegradable functional group in the light emitting element dispersant is decomposed by the applied light.

4. The method of claim 3, wherein the removing of the solvent and the dispersant fragment includes heat-treating the ink sprayed on the target substrate to volatilize the solvent and the dispersant fragment.

5. The method of claim 4, wherein the heat treatment is performed in a temperature range of 100° ° C. to 200° C.

6. The method of claim 4, wherein
the light emitting element dispersant has a molecular weight in a range of 500 g/mol to 800 g/mol, and
the dispersant fragment has a boiling point in a temperature range of 100° C. to 200° ° C.

7. The method of claim 2, wherein the light emitting element dispersant is a compound represented by one of Chemical Structural Formulas 1 to 4:

[Chemical Structural Formula 1]

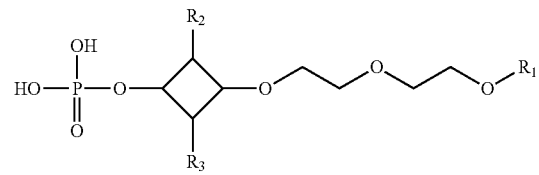

[Chemical Structural Formula 2]

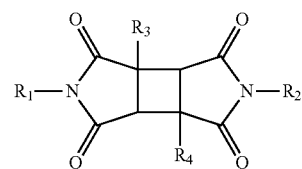

-continued

[Chemical Structural Formula 3]

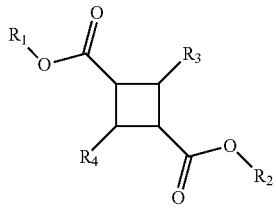

[Chemical Structural Formula 4]

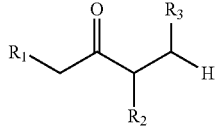

wherein in Chemical Structural Formulas 1 to 4,
$R_1$, $R_2$, $R_3$, and $R_4$ are each independently one of an alkyl group of $C_1$-$C_{10}$, an alkenyl group of $C_2$-$C_{10}$, an alkynyl group of $C_2$-$C_{10}$, an alkyl ether group of $C_1$-$C_{10}$, and an alkenyl ether group of $C_2$-$C_{10}$.

8. The method of claim 2, wherein
the light emitting element includes a semiconductor crystal core and an insulating material layer formed to surround an outer surface of the semiconductor crystal core, and
the insulating material layer and the solvent have different polarities from each other.

9. The method of claim 8, wherein
at least a part of the light emitting element dispersant surrounds an outer surface of the light emitting element in the solvent to form a dispersion structure, and
the dispersion structure orients the first functional group of the light emitting element dispersant toward a center of the dispersion structure, and orients the second functional group of the light emitting element dispersant toward an outside of the dispersion structure.

10. The method of claim 9, wherein, in the generating of the electric field, the light emitting elements are aligned between the first electrode and the second electrode by the electric field generated on the target substrate.

* * * * *